United States Patent
Chainer et al.

(10) Patent No.: US 10,823,512 B2
(45) Date of Patent: *Nov. 3, 2020

(54) COLD PLATE WITH RADIAL EXPANDING CHANNELS FOR TWO-PHASE COOLING

(71) Applicant: International Business Machines Corporation, Armonk, NY (US)

(72) Inventors: Timothy Joseph Chainer, Putnam Valley, NY (US); Pritish Ranjan Parida, Fishkill, NY (US); Fanghao Yang, Somerset, NJ (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 79 days.

This patent is subject to a terminal disclaimer.

(21) Appl. No.: 16/123,550

(22) Filed: Sep. 6, 2018

(65) Prior Publication Data
US 2020/0025455 A1  Jan. 23, 2020

Related U.S. Application Data

(63) Continuation of application No. 15/276,426, filed on Sep. 26, 2016, now Pat. No. 10,139,168.

(51) Int. Cl.
| | | |
|---|---|---|
| *F28D 9/00* | (2006.01) | |
| *F28F 9/02* | (2006.01) | |
| *H01L 23/473* | (2006.01) | |
| *H01L 23/427* | (2006.01) | |

(52) U.S. Cl.
CPC ............ *F28D 9/0093* (2013.01); *F28F 9/02* (2013.01); *H01L 23/427* (2013.01); *H01L 23/473* (2013.01)

(58) Field of Classification Search
CPC ............... H01L 23/4735; H01L 23/473; F28F 2260/02; F28D 9/0093
USPC ........................................................ 165/80.4
See application file for complete search history.

(56) References Cited

U.S. PATENT DOCUMENTS

| | | | |
|---|---|---|---|
| 4,838,041 A | 6/1989 | Bellows et al. | |
| 5,056,127 A | 10/1991 | Iversen et al. | |
| 5,365,400 A * | 11/1994 | Ashiwake | H01L 23/433 |
| | | | 165/80.4 |
| 5,661,638 A | 8/1997 | Mira | |
| 6,349,554 B2 | 2/2002 | Patel et al. | |
| 6,575,231 B1 | 6/2003 | Wu | |
| 6,886,249 B2 | 5/2005 | Smalc | |
| 7,213,636 B2 | 5/2007 | Bhatti et al. | |

(Continued)

OTHER PUBLICATIONS

Chen, et al., "Enthalpy-based System-Model for Pumped Two-phase Cooling Systems," Last Accessed: Aug. 21, 2016, 8 pages.

(Continued)

*Primary Examiner* — Paul Alvare
(74) *Attorney, Agent, or Firm* — Amin, Turocy & Watson, LLP

(57) ABSTRACT

A cold plate structure in a two-phase cooling system is provided. The cold plate, where the cold plate structure has at least one microchannel with a cross-sectional area along a radial direction, wherein the cross-sectional area expands in a first direction that is substantially tangential to the radial direction and expands in a second direction that is substantially tangential to the radial direction and substantially tangential to the first direction.

20 Claims, 18 Drawing Sheets

(56) References Cited

U.S. PATENT DOCUMENTS

| | | | |
|---|---|---|---|
| 7,278,466 B2 | 10/2007 | Fujisaki | |
| 7,331,380 B2 | 2/2008 | Ghosh et al. | |
| 7,334,630 B2 * | 2/2008 | Goodson | F04B 19/006 165/104.33 |
| 7,987,899 B2 | 8/2011 | Kurtz et al. | |
| 8,056,615 B2 | 11/2011 | Downing | |
| 8,263,843 B2 * | 9/2012 | Kim | B82Y 10/00 252/503 |
| 9,151,544 B2 | 10/2015 | Hwang et al. | |
| 9,313,921 B2 | 4/2016 | Brunschwiler et al. | |
| 2003/0062149 A1 * | 4/2003 | Goodson | F04B 19/006 165/104.11 |
| 2005/0205241 A1 * | 9/2005 | Goodson | F04B 19/006 165/80.4 |
| 2005/0225938 A1 * | 10/2005 | Montgomery | H01L 23/4336 361/695 |
| 2005/0244280 A1 * | 11/2005 | Malone | F04B 19/006 417/286 |
| 2006/0137860 A1 * | 6/2006 | Prasher | F28D 15/0266 165/104.33 |
| 2006/0144568 A1 * | 7/2006 | Crocker | H01L 23/473 165/104.33 |
| 2007/0039720 A1 * | 2/2007 | Ghosh | H01L 23/473 165/104.33 |
| 2007/0069420 A1 * | 3/2007 | Kozyra | B29C 45/14778 264/259 |
| 2007/0193721 A1 * | 8/2007 | Tilton | F25B 43/04 165/104.19 |
| 2008/0169087 A1 * | 7/2008 | Downing | F28D 15/0233 165/80.4 |
| 2009/0021908 A1 * | 1/2009 | Patel | G06F 1/20 361/688 |
| 2009/0065178 A1 | 3/2009 | Kasezawa et al. | |
| 2009/0218078 A1 * | 9/2009 | Brunschwiler | G06F 1/20 165/104.33 |
| 2011/0088875 A1 | 4/2011 | Hou | |
| 2011/0232885 A1 | 9/2011 | Kaslusky et al. | |
| 2013/0192807 A1 * | 8/2013 | DeKeuster | H01M 10/6551 165/170 |
| 2014/0071628 A1 * | 3/2014 | Brunschwiler | H05K 7/20327 361/700 |
| 2014/0262186 A1 * | 9/2014 | Kandlikar | F28F 13/08 165/177 |
| 2015/0253089 A1 * | 9/2015 | Fan | F28F 21/02 165/185 |
| 2017/0092565 A1 * | 3/2017 | Chen | H01L 23/473 |

OTHER PUBLICATIONS

Chen, et al., "Enthalpy-based System-Model for Pumped Two-phase Cooling Systems," IEEE ITherm 2016 Japer # ITherm2016—443, Jun. 2, 2016, 12 pages.

Sridhar, et al., "Thermal Design of a Hierarchical Radially Expanding Cavity for Two-Phase Cooling of Integrated Circuits," Proceedings of the ASME 2015 International Technical Conference and Exhibition & on Packaging and Integration of Electronic and Photonic Microsystems InterPACK 2015 Jul. 6-9, 2015, San Francisco, USA, 10 pages.

Tuckerman, et al., "High-Performance Heat Sinking for VLSI," IEEE Electron Device Letters, vol. EDL-2, No. 5, May 1981, pp. 126-129.

Office Action for U.S. Appl. No. 15/276,426 dated Jan. 24, 2018, 36 pages.

* cited by examiner

COLD PLATE WITH RADIAL EXPANDING CHANNELS FOR TWO-PHASE COOLING

STATEMENT REGARDING FEDERALLY SPONSORED RESEARCH OR DEVELOPMENT

This invention was made with government support under contract number FA8650-14-C-7466 awarded by U.S. Defense Advanced Research Projects Agency. The government has certain rights to this invention.

BACKGROUND

The subject disclosure relates to a cold plate structure in a two-phase cooling system.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments herein, systems, computer-implemented methods, apparatus and/or computer program products that employ a cold plate with three-dimensional radial expanding microchannels to facilitate cooling in a two-phase cooling system are described.

According to an embodiment, a system is provided. The system comprises a cold plate comprising a manifold plate comprising a cold plate inlet and a cold plate outlet; and a base plate that comprises a recessed area. The cold plate also comprises a stackable layer between the manifold plate and the base plate. The stackable layer can comprise a plurality of stackable plates stacked on the base plate, and respective stackable plates of the plurality of stackable plates can comprise an outer edge, a central core region, and a plurality of spokes that extend radially from the central core region to the outer edge. The central core region can have a hole aligned with the cold plate inlet; and a first central core region of a first stackable plate that is not immediately adjacent to the base plate can have a first size that is larger than a second size of a second central core region of a second stackable plate closer to the base plate than the first stackable plate. The cold plate inlet and the cold plate outlet can be unsealed and a remaining portion of the cold plate can be sealed.

In another embodiment, another system is provided. The system can comprise a cold plate comprising a manifold plate comprising a cold plate inlet and a cold plate outlet; and a base plate that comprises a recessed area. The cold plate can also comprise a middle layer between the manifold plate and the base plate, wherein the middle layer comprises: a central region that has a conical shape with a narrow end of the central region adjacent to the base plate, and the central region having a hole substantially at the center of the central region that extends from a large end of the central region to the narrow end. The middle layer can also comprise an outer wall; and a plurality of walls that extend radially from the central region to the outer wall and form a plurality of microchannels. The cold plate inlet and the cold plate outlet can be unsealed and a remaining portion of the cold plate can be sealed.

In another embodiment, a cold plate is provided. The cold plate can comprise a microchannel that extends along a line from an internal point of the cold plate to an outer wall of the cold plate. The microchannel can expand along the line in a first direction substantially tangential to the line, and expand along the line in a second direction substantially tangential to the line and substantially tangential to the first direction.

DETAILED DESCRIPTION

Figure 1:
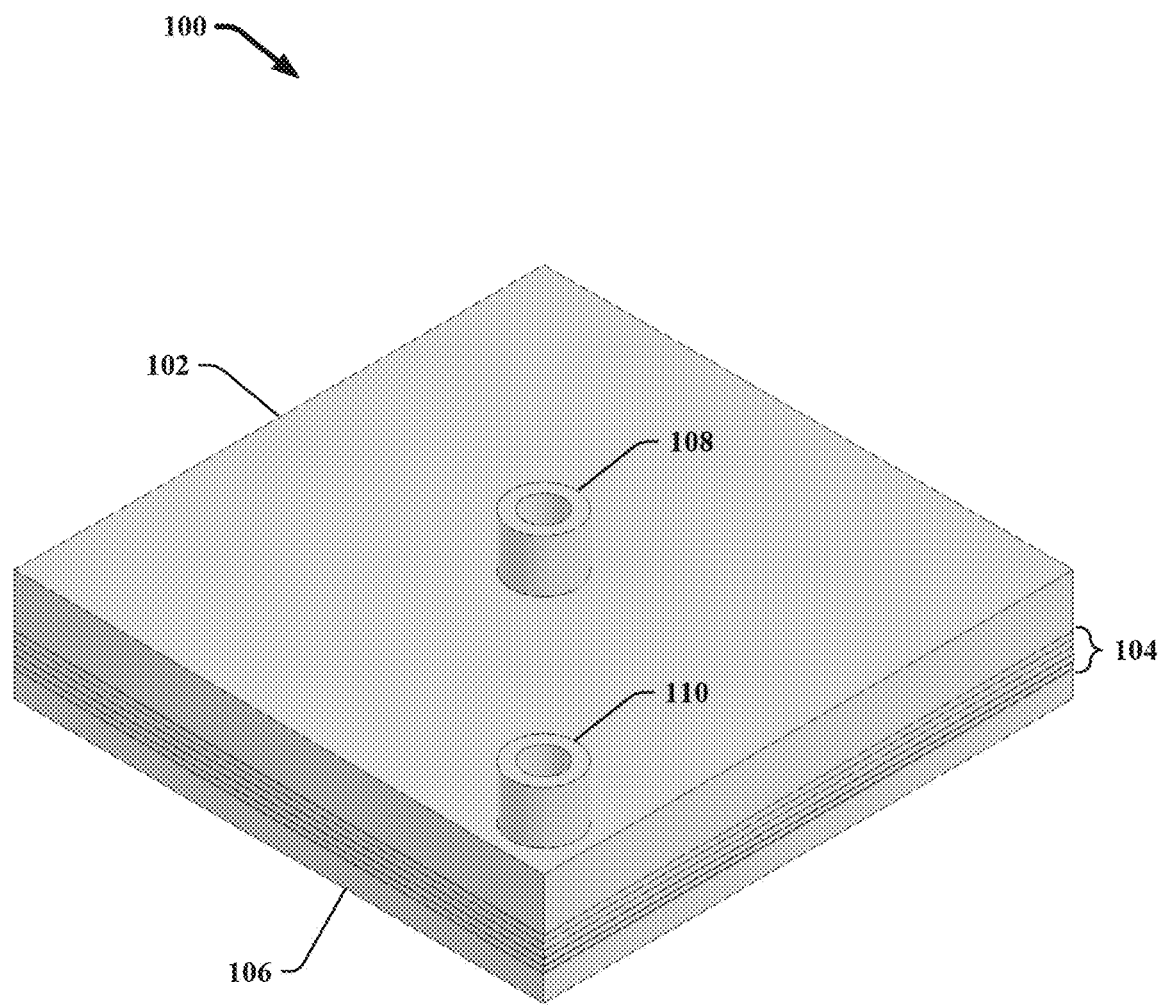
FIG. 1 illustrates a block diagram of an example, non-limiting cold plate that facilitates dissipating heat in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident; however in various cases, that the one or more embodiments can be practiced without these specific details.

In a two-phase cooling system for a device (e.g., an electronic device or any other suitable device that comprises a heat source), a cold plate can be used to maintain the electronic device in a defined temperature range by dissipating heat generated by one or more components (e.g., heat source) of the device. In gas-liquid two-phase flow, a void fraction is defined as the fraction of the flow channel volume that is occupied by the gas phase. For a two-phase cooling system, the void fraction is dramatically increased along the direction of flow in a cold plate with parallel microchannels since the density of vapor is significantly smaller than the density of liquid and a large volume of vapor is generated during the vaporization that occurs inside the microchannels. For example, when 1 unit mass of the coolant flowing in the microchannels converts from the liquid phase to the vapor phase, the change in volume occupied by that 1 unit mass of coolant can be ~20× to 2000×, depending upon the type of coolant under consideration. Looking at the flow cross-section, the vapors that gets generated in this process moves to center and the liquid gets pushed towards the channel walls resulting in a thin liquid film on the thermal walls. Such a liquid film is desirable from the thermal performance point of view. However, as more and more vapor gets generated and coalesce, the void fraction grows. This change in void fraction leads to a significant increase in a velocity of vapor phase flow relative to the liquid phase flow velocity. These relatively high velocity vapors result in strong shear forces that creates waves in the liquid film present adjacent to the channel walls causing the disruption of the liquid film. Disruption of the liquid film make the cold-plate susceptible to premature dry-out behavior at low vapor quality (~30%) and thereby, degrades the thermal performance of the cold-plate. Vapor quality refers to the mass flow rate of vapor at the cold-plate exit relative to the coolant mass flow rate at the cold-plate inlet. For best thermal and hydraulic performance, an exit vapor quality of 80%-100% is desirable. Dry-out conditions here refers to a situation where coolant supply is insufficient to remove the heat. Furthermore, the void fraction acts as a blockage for the coolant flow and results in reduced cross-section for liquid coolant flow. Due to this, a larger pressure drop is required across the length of the microchannels to drive the coolant flow through the microchannels. Further, for any material, the saturation temperature (commonly known as the boiling point) is a strong function of pressure and it increases with increasing pressure and decreases with decreasing pressure. For example, water boils at 100 C at a pressure of 1 atmosphere (101.325 kPa) and at 50 C at a pressure of 12.33 kPa, refrigerant R1234ze boils at 30 C at a pressure of 578.4 kPa and at 20 C at a pressure of 427.4 kPa. So a large change in pressure across the microchannel results in a corresponding large change in the coolant saturation temperature (boiling point) which in turn results in a large temperature variation across the cold-plate. For example, a pressure drop of 80 kPa across the cold plate having water as the coolant and an inlet pressure of 101.3 kPa, will result in 50 C variation in temperature across the cold-plate. Such large temperature variations are not desired in a cooling system for an electronic device.

In one or more embodiments described herein, a two-phase cooling system can include a cold plate comprising three-dimensional radial expanding microchannels. The cold plate can have multiple three-dimensional radial expanding microchannels. A radial expanding microchannel can have a cross-sectional area along a radial direction (e.g., a direction from an inlet to an outlet of the radial expanding microchannel), wherein the cross-sectional area expands in a first direction that is substantially tangential to the radial direction and expands in a second direction that is substantially tangential to the radial direction and substantially tangential to the first direction. For example, the cross-sectional area of the radial expanding microchannel can be larger at a point in the radial direction closer to the outlet than the cross-sectional area of the radial expanding microchannel at another point in the radial direction closer to the inlet. Thus, the microchannel can have a small inlet and a large outlet. The three-dimensional radial expanding microchannels can reduce and/or eliminate the likelihood of flow instabilities in a two-phase cooling system, which can manifest in the form of mass flux fluctuation, pressure drop fluctuation, and/or reverse flows, can lead to a premature dry-out condition in the cold plate and can result in premature failure of components of the device.

In another example, using a cylindrical coordinate system for a cold plate, a radial (r) direction can be a first coordinate direction, an azimuthal (theta) direction can be a second coordinate direction, and a vertical direction (z) can be a third coordinate direction. A radial expanding microchannel can have a cross-sectional area that expands in the azimuthal (theta) direction and in the vertical (z) direction. The radial expanding microchannel can have a cross-sectional area at point r in the radial direction that is defined $r*theta*z$. An inlet of the radial expanding microchannel can have a cross-sectional area that is defined by $r_1*theta*z_1$, and an outlet of the radial expanding microchannel can have a cross-sectional area that is defined by $r_2*theta*z_2$, where $r_2>r_1$, $z_2>z_1$, and theta is a constant angle.

In a further example, the radial expanding microchannel can expand in a direction (e.g. first direction and/or second direction) at different rates at different points along the radial direction. For example, theta at a first point $r_3$ in the radial direction can be $theta_1$, while theta at a second point $r_4$ in the radial direction can be $theta_2$, where $r_4>r_3$, $theta_2>theta_1$, and $z_2>z_1$.

FIG. 1 illustrates a block diagram of an example, non-limiting cold plate 100 that facilitates dissipating heat in accordance with one or more embodiments described herein. Repetitive description of like elements employed in one or more embodiments described herein is omitted for sake of brevity.

As shown in FIG. 1, the cold plate 100 can include a manifold 102, a middle layer 104, and a base 106. It is to be appreciated that cold plate 100, manifold 102, middle layer 104, and base 106 can be made out of any suitable material for a cold plate 100, non-limiting examples of which include metal, plastic, carbon fiber, graphene, alloy, polymer, resin, or any other suitable material, or any combination thereof. Furthermore, in various embodiments, manifold 102, middle layer 104, and base 106 can be bonded together using any suitable bonding mechanism, not limiting examples of which include, diffusion bonding, eutectic bonding, welding, sintering, adhesive, mechanical, or any other suitable bonding mechanism. Furthermore, the bonding mechanism can form a seal against leakage of liquid and/or gas. In addition, cold plate 100, manifold 102, middle layer 104, and/or base 106 can be produced by three-dimensional printing.

In some embodiments, manifold 102 can have an inlet 108 and an outlet 110. Inlet 108 can allow a coolant to enter cold plate 100 and outlet 110 can allow the coolant to exit cold plate 100. For example, in some embodiments, a liquid coolant can enter inlet 108 and can exit outlet 110 in the form of a vapor and/or liquid coolant.

While examples herein depict cold plate 100 in the shape of a square, it is to be appreciated that cold plate 100 can be in any suitable shape, non-limiting examples of which can include an ellipse, a polygon, or any other suitable shape. For example, cold plate 100 can be in a shape that is based on a shape of a component that is a heat source. In another non-limiting example, cold plate 100 can be in a shape that matches a shape of a component of a heat source. In a further non-limiting example, cold plate 100 can be in a shape that matches a shape of a portion of a component that is a heat source.

Figure 2:
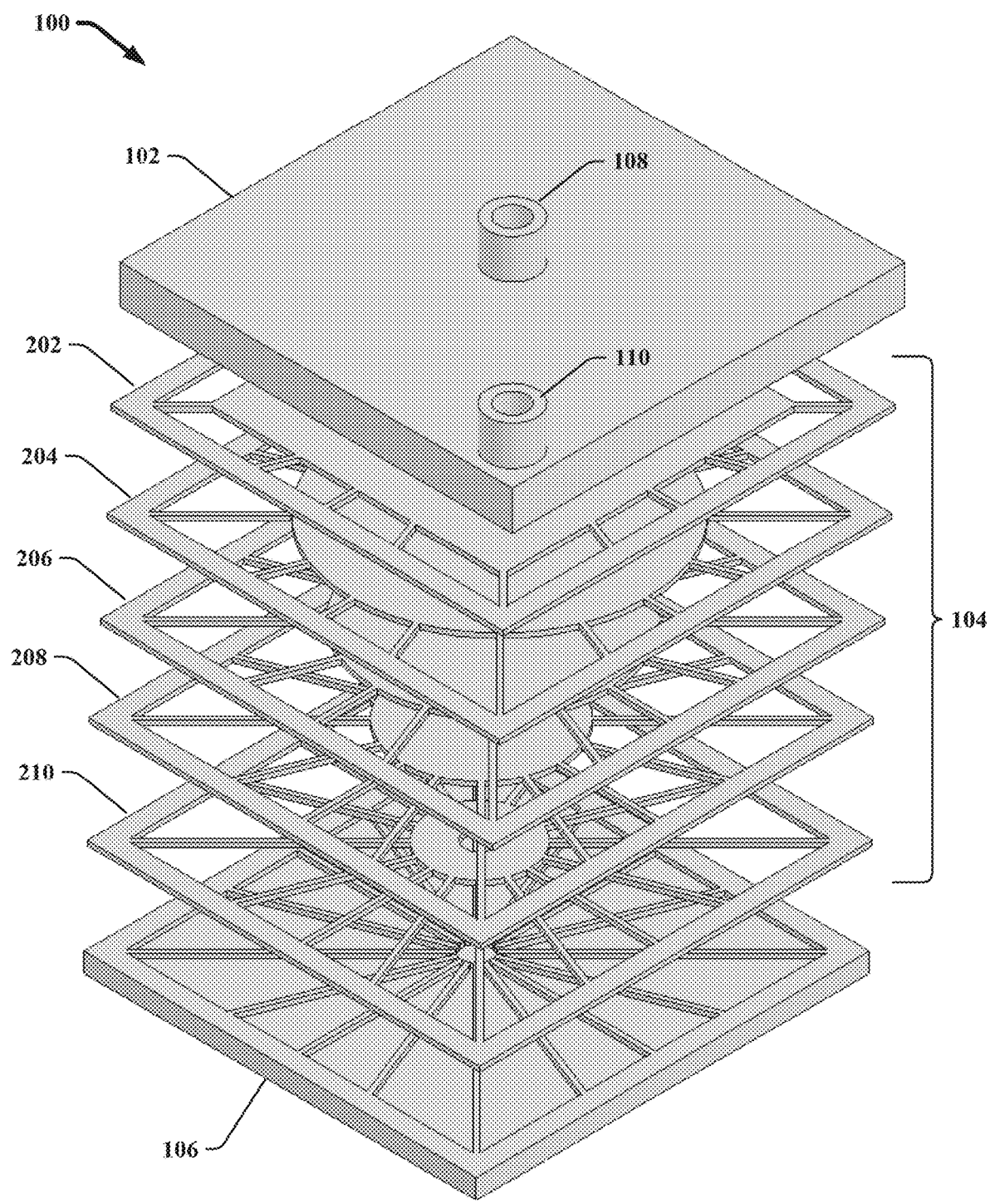
FIG. 2 illustrates a block diagram of an example, non-limiting cold plate in a partially exploded view in accordance with one or more embodiments described herein.

FIG. 2 illustrates a block diagram of an example, non-limiting cold plate 100 in a partially exploded view in accordance with one or more embodiments described herein. Repetitive description of like elements employed in other embodiments described herein is omitted for sake of brevity.

In one or more embodiments, middle layer 104 can comprises a plurality of stackable plates 202, 204, 206, 208, and 210 that when stacked together with manifold 102 and base plate 106 form three-dimensional radial expanding microchannels. While five stackable plates 202, 204, 206, 208, and 210 are shown, it is to be appreciated that any suitable number of stackable plates can be employed. Furthermore, employing stackable plates can allow for easier manufacturing and assembly of cold plate 100. For example, stackable plates 202, 204, 206, 208, and 210 can be produced using any suitable process, non-limiting examples of which can include stamping, punching, machining, chemical etching, laser cutting, three-dimensional printing, or any other suitable process.

Figure 3:
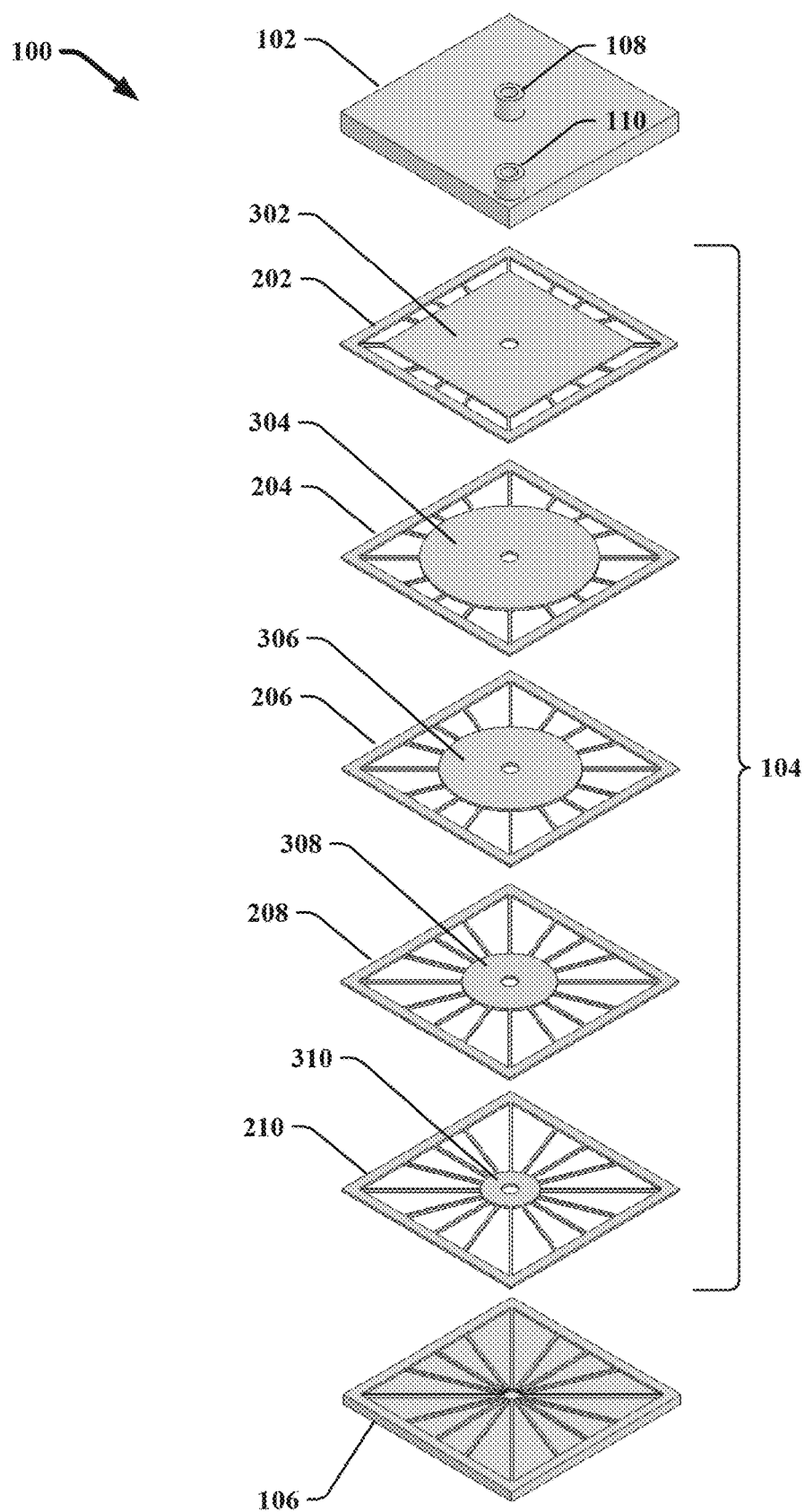
FIG. 3 illustrates a block diagram of an example, non-limiting cold plate in an exploded view in accordance with one or more embodiments described herein.

FIG. 3 illustrates a block diagram of an example, non-limiting cold plate 100 in an exploded view in accordance with one or more embodiments described herein. Repetitive description of like elements employed in other embodiments described herein is omitted for sake of brevity.

Stackable plates 202, 204, 206, 208, and 210 have respective core regions 302, 304, 306, 308, and 310 that are connected to outer edges of stackable plates 202, 204, 206, 208, and 210 by spokes that extend (e.g., radially extend) from the core regions to the outside edges. In some embodiments, between the spokes of stackable plates 202, 204, 206, 208, and 210 are orifices. Base plate 106 can have a recessed area and also have spokes in the recessed area that extend from the outer edge of base plate 106 to a central area of base plate 106 but leave a space between the ends of neighboring spokes at the central area. This allows for coolant to pass through the spaces.

In the embodiment shown, the spokes of the stackable plates 202, 204, 206, 208, and 210 and base plate 106 are in alignment such that when the stackable plates 202, 204, 206, 208, and 210 and base plate 106 are stacked together, the spokes form side walls for the three-dimensional radial expanding microchannels. The side walls are closer together near the core region and farther apart near the outer edges, thus expanding a microchannel from the central tube to the outer edge in a first direction substantially tangential to the direction that the microchannel radiates from the central tube to the outer edge. Base plate 106 can form a bottom wall for the three-dimensional radial expanding microchannels. In some embodiments, core regions 302, 304, 306, 308, and 310 can have holes substantially at the center of the core regions that are in alignment such that when stackable plates 202, 204, 206, 208, and 210 are stacked together, the holes form a central tube from inlet 108 to base plate 106. The tube can be sealed against leakage of liquid or gas until reaching base plate 106. This allows for coolant to enter inlet 108 and be directed to base plate 106 and through the spaces between the spokes of base plate 106 and into the three-dimensional radial expanding microchannels. It is to be appreciated that in an embodiment, the spokes of base plate 106 can be optionally excluded from base plate 106, and still allow the coolant to enter the three-dimensional radial expanding microchannels based on the recessed area of base plate 106 and the side walls formed by the spokes of stackable plates 202, 204, 206, 208, and 210.

Core regions 302, 304, 306, 308, and 310 can be larger in size the closer the associated stackable plate stackable plates 202, 204, 206, 208, and 210 are to manifold 102. For example, core region 310 can have a larger size (e.g., area, diameter, or length) than core region 304, and core region 304 can have a larger size (e.g., area, diameter, or length) than core region 306, and core region 306 can have a larger size (e.g., area, diameter, or length) than core region 308, and core region 308 can have a larger size (e.g., area, diameter, or length) than core region 310. The core regions 302, 304, 306, 308, and 310 of the stackable plates 202, 204, 206, 208, and 210 and manifold 102 when stacked together can form a ceiling for the three-dimensional radial expanding microchannels. The configuration that provides an increasing size of core regions 302, 304, 306, 308, and 310 as the core regions are closer to manifold 102 can provide for expanding a microchannel from the central tube to the outer edge in a second direction that is substantially tangential to the direction that the microchannel radiates (e.g., extends radially) from the central tube to the outer edge and substantially tangential to the first direction.

This expansion of the microchannel in a second direction can expand two-phase flow in an additional dimension that reduces flow velocity. This expansion can also enhance flow stability and/or improve the energy efficiency of a two-phase cooling system that employs cold plate 100. In this example, the ceiling is formed to produce stepwise expansion of the microchannel in the second direction. However, it is to be appreciated that in other embodiments the expansion of the microchannel in the second direction can be continuous, for example, in a straight or curved surface formed by the ceiling. It is to be appreciated that the expansion of the microchannel in the second direction can be in any suitable form that produces an expansion in the second direction.

In this example, core regions 304, 306, 308, and 310 are shaped as circles, while core region 302 is shaped as a square. Core region 302 can have a square shape that allows the orifices of stackable plate 202 to substantially align with a channel 802 in manifold 102 for directing coolant to outlet 110. However, is it to be appreciated that the core regions can be of any suitable shape. In a non-limiting example, all core regions of stackable plates in middle layer 104 can have the same shape. In another non-limiting example, one or more core regions of stackable plates in middle layer 104 can have different shapes than other core regions of stackable plates in middle layer 104. In some embodiments, the outer edges 804 of manifold 102, outer edges of stackable plates 202 (e.g. outer edges 1002), 204, 206, 208, and 210 (e.g. outer edges 902), and outer edges 702 of base plate 106 when stacked together form end walls for the three-dimensional radial expanding microchannels.

Figure 4:
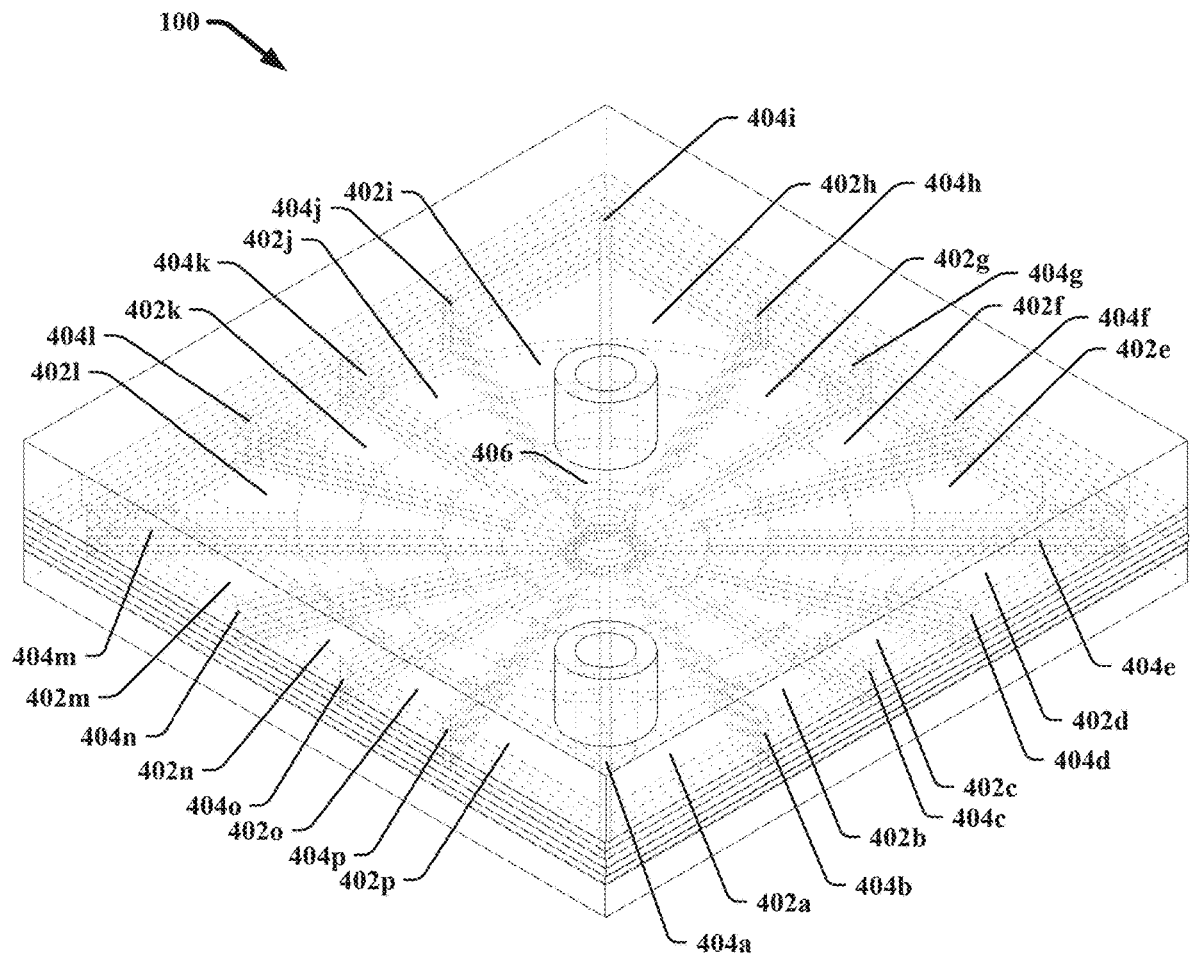
FIG. 4 illustrates a block diagram of an example, non-limiting cold plate in a wireframe view in accordance with one or more embodiments described herein.

FIG. 4 illustrates a block diagram of an example, non-limiting cold plate 100 in a wireframe view in accordance with one or more embodiments described herein. Cold plate 100 has three-dimensional radial expanding microchannels 402a, 402b, 402c, 402d, 402e, 402f, 402g, 402h, 402i, 402j, 402k, 402l, 402m, 402n, 402o, and 402p. While sixteen three-dimensional radial expanding microchannels are depicted, it is to be appreciated that any suitable number of three-dimensional radial expanding microchannels can be employed. Cold plate 100 has side walls 404a, 404b, 404c, 404d, 404e, 404f, 404g, 404h, 404i, 404j, 404k, 4041, 404m, 404n, 404o, and 404p of the three-dimensional radial expanding microchannels 402a, 402b, 402c, 402d, 402e, 402f, 402g, 402h, 402i, 402j, 402k, 402l, 402m, 402n, 402o, and 402p. Cold plate 100 also has tube 406.

Figure 5:
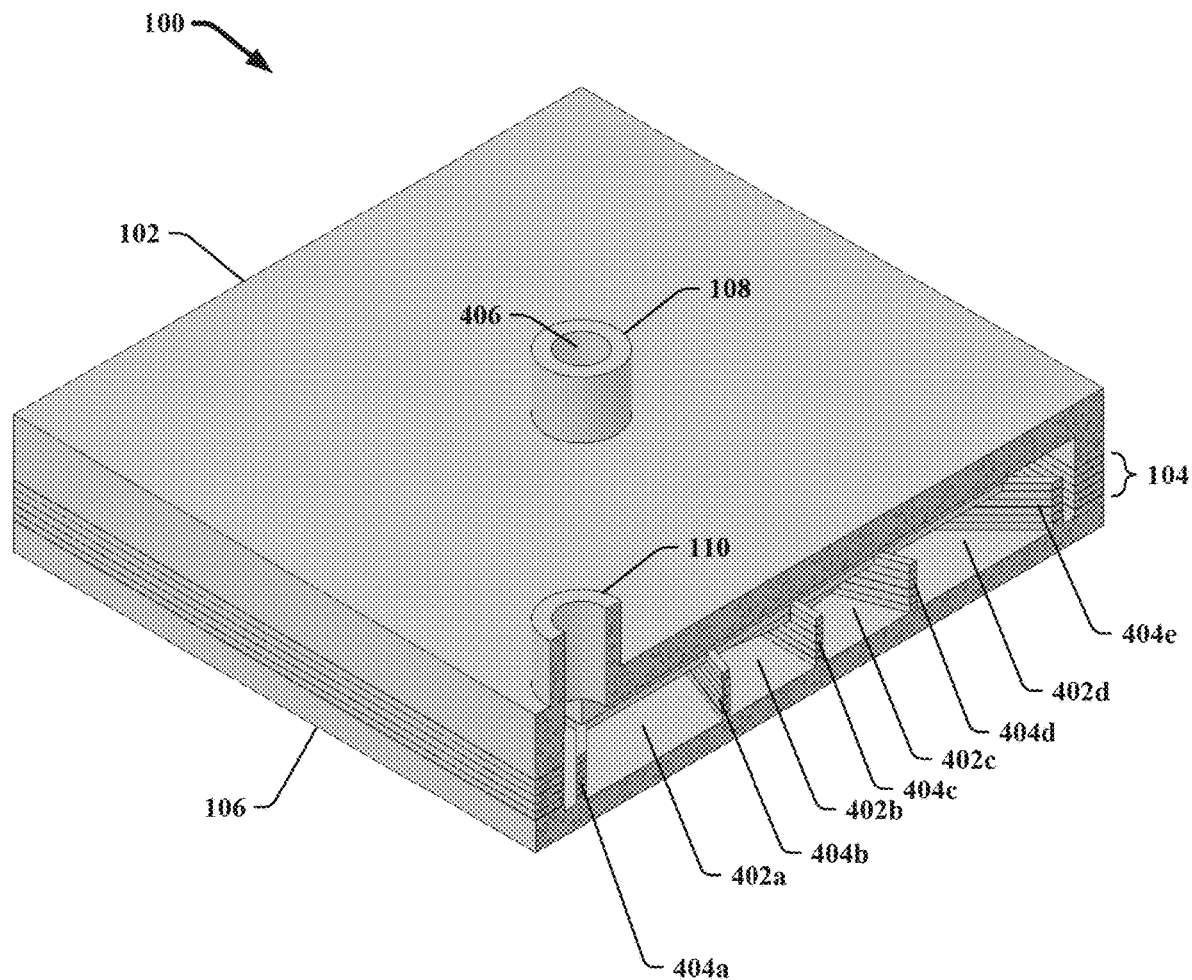
FIG. 5 illustrates a block diagram of an example, non-limiting cold plate in a section view of a plane intersecting through the outlet in accordance with one or more embodiments described herein.
Figure 6:
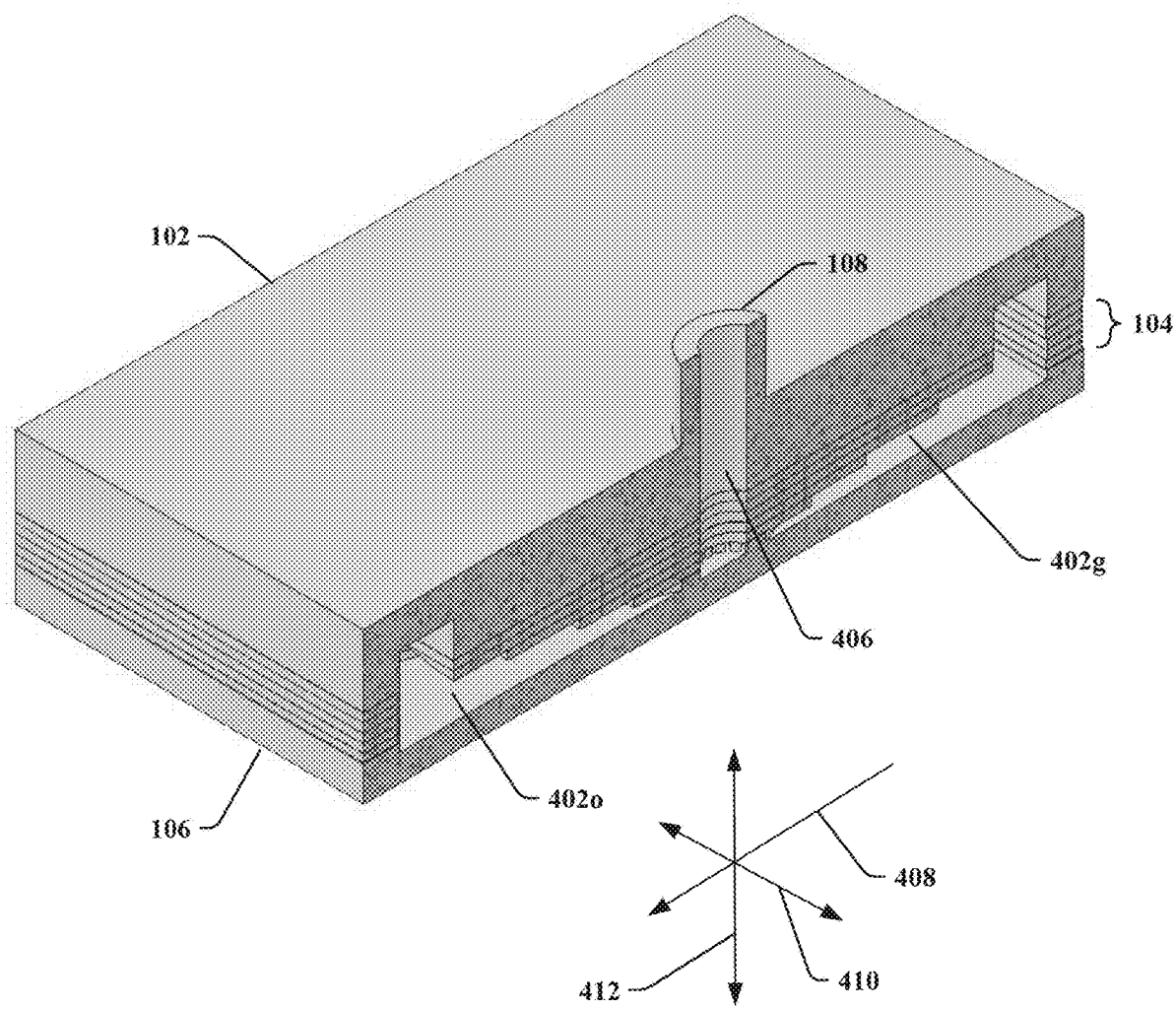
FIG. 6 illustrates a block diagram of an example, non-limiting cold plate in a section view of a plane intersecting through the inlet in accordance with one or more embodiments described herein.

FIG. 5 illustrates a block diagram of an example, non-limiting cold plate 100 in a section view of a plane intersecting through outlet 110 in accordance with one or more embodiments described herein. FIG. 6 illustrates a block diagram of an example, non-limiting example cold plate 100 in a section view of a plane intersecting through inlet 108 in accordance with one or more embodiments described herein. In a non-limiting example, radially three-dimensional radial expanding microchannel 402o, extends in the radial direction (r) 408 from tube 406 and has a cross-sectional area that expands in a first direction 410 and a second direction 412.

Figure 7A:
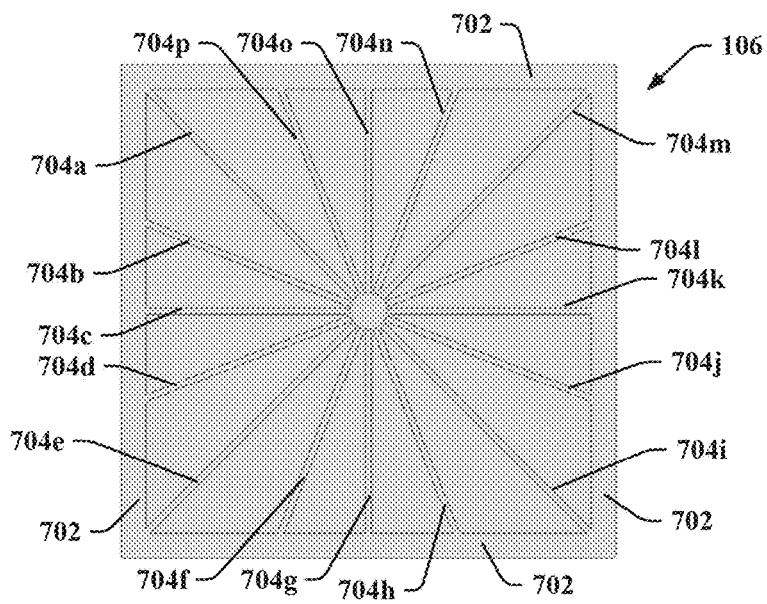
FIG. 7A illustrates a block diagram of an example, non-limiting base plate from a top view in accordance with one or more embodiments described herein.
Figure 7B:
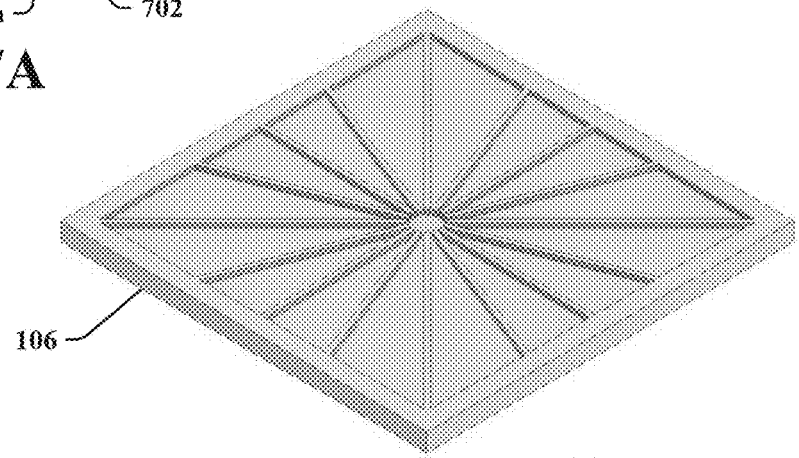
FIG. 7B illustrates a block diagram of an example, non-limiting base plate from a top perspective view in accordance with one or more embodiments described herein.
Figure 7C:
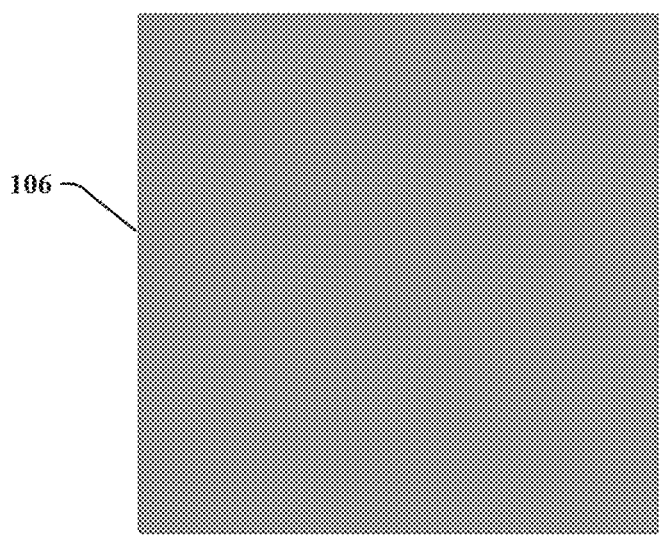
FIG. 7C illustrates a block diagram of an example, non-limiting base plate from a bottom view in accordance with one or more embodiments described herein.

FIG. 7A illustrates a block diagram of an example, non-limiting base plate 106 from a top view in accordance with one or more embodiments described herein. Base plate 106 has spokes 704a, 704b, 704c, 704d, 704e, 704f, 704g, 704h, 704i, 704j, 704k, 7041, 704m, 704n, 704o, and 704p that extend from the outer edge 702 of base plate 106 to a central area of base plate 106, but leave a space between the ends of neighboring spokes 704a, 704b, 704c, 704d, 704e, 704f, 704g, 704h, 704i, 704j, 704k, 7041, 704m, 704n, 704o, and 704p at the central area. FIG. 7B illustrates a block diagram of an example, non-limiting example base plate 106 from a top perspective view in accordance with one or more embodiments described herein. FIG. 7C illustrates a block diagram of an example, non-limiting example base plate 106 from a bottom view in accordance with one or more embodiments described herein.

Figure 8A:
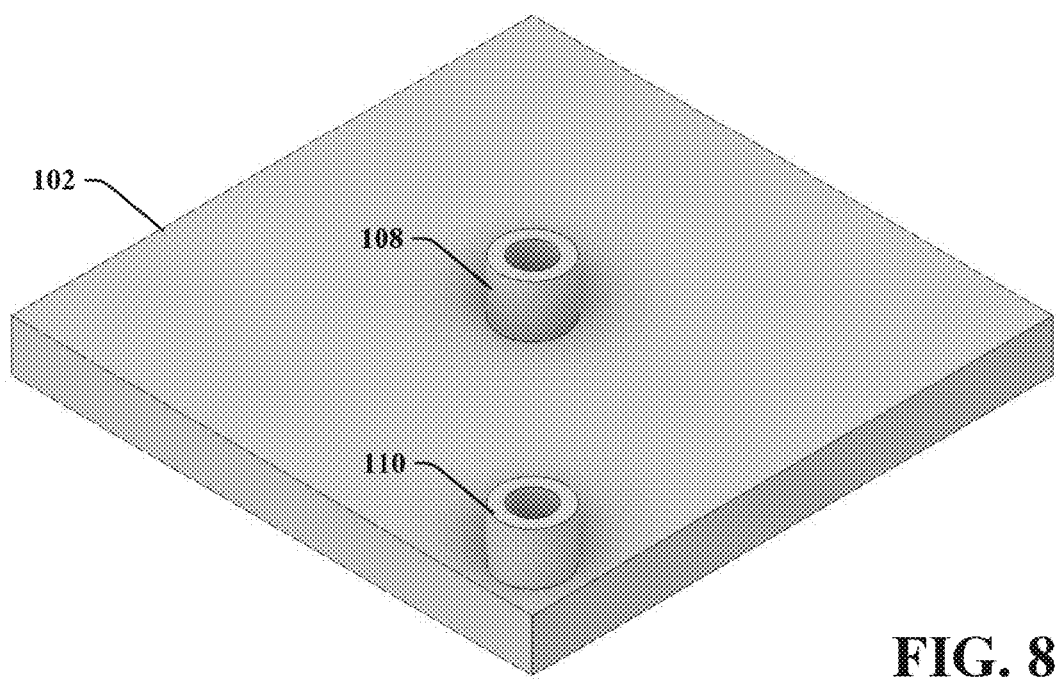
FIG. 8A illustrates a block diagram of an example, non-limiting manifold from a top perspective view in accordance with one or more embodiments described herein.
Figure 8B:
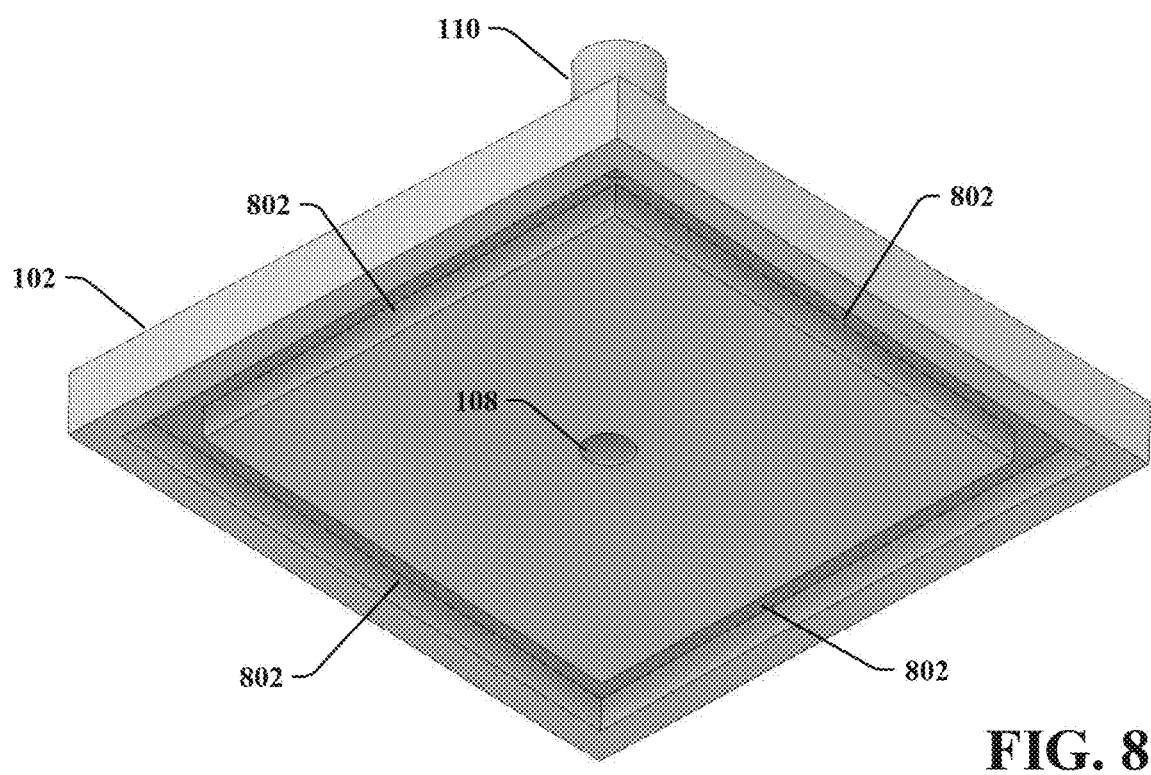
FIG. 8B illustrates a block diagram of an example, non-limiting manifold from a bottom perspective view in accordance with one or more embodiments described herein.
Figure 8C:
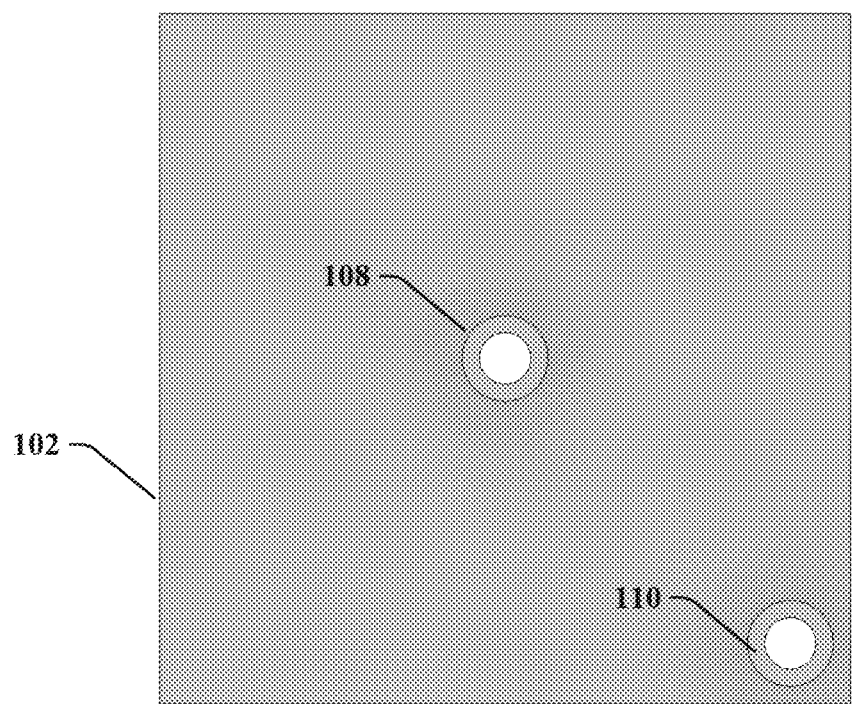
FIG. 8C illustrates a block diagram of an example, non-limiting manifold from a top view in accordance with one or more embodiments described herein.
Figure 8D:
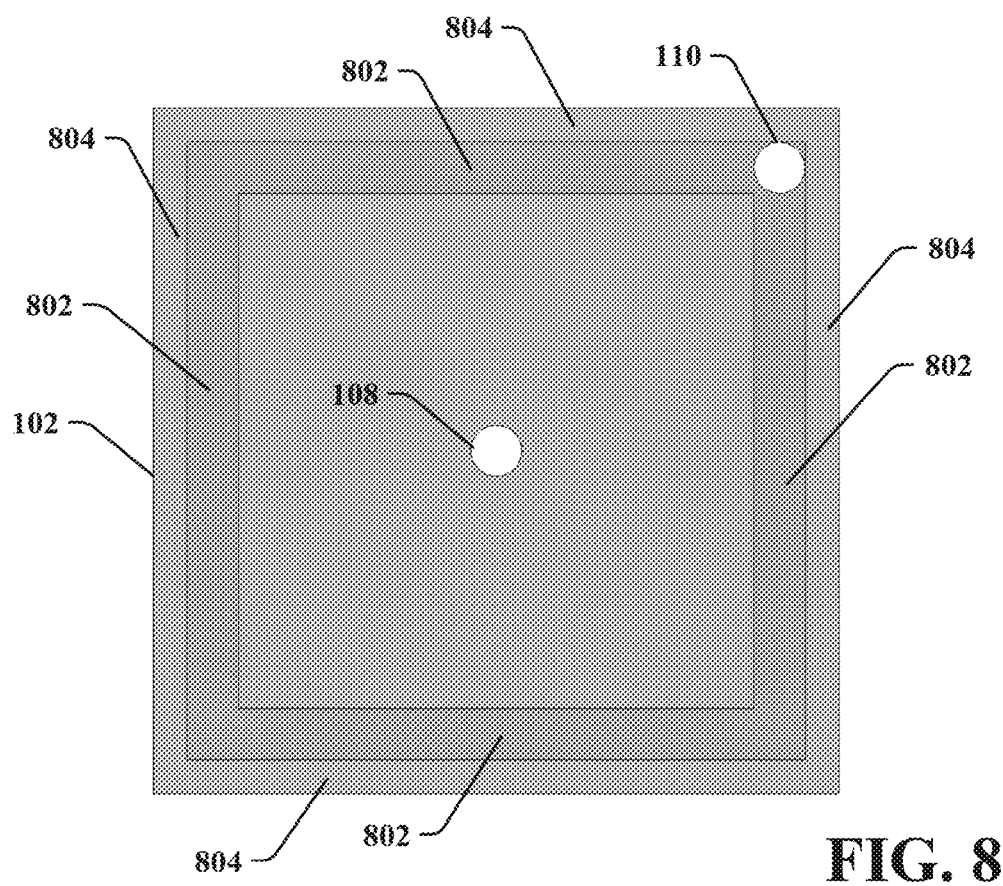
FIG. 8D illustrates a block diagram of an example, non-limiting manifold from a bottom view in accordance with one or more embodiments described herein.

FIG. 8A illustrates a block diagram of an example, non-limiting manifold 102 from a top perspective view in accordance with one or more embodiments described herein. FIG. 8B illustrates a block diagram of an example, non-limiting example manifold 102 from a bottom perspective view in accordance with one or more embodiments described herein. Manifold 102 has a channel 802 that extends along the edge of manifold 102 to direct coolant to outlet 110 which is located above a portion of channel 802. FIG. 8C illustrates a block diagram of an example, non-limiting example manifold 102 from a top view in accordance with one or more embodiments described herein. FIG. 8D illustrates a block diagram of an example, non-limiting example manifold 102 from a bottom view in accordance with one or more embodiments described herein.

Figure 9:
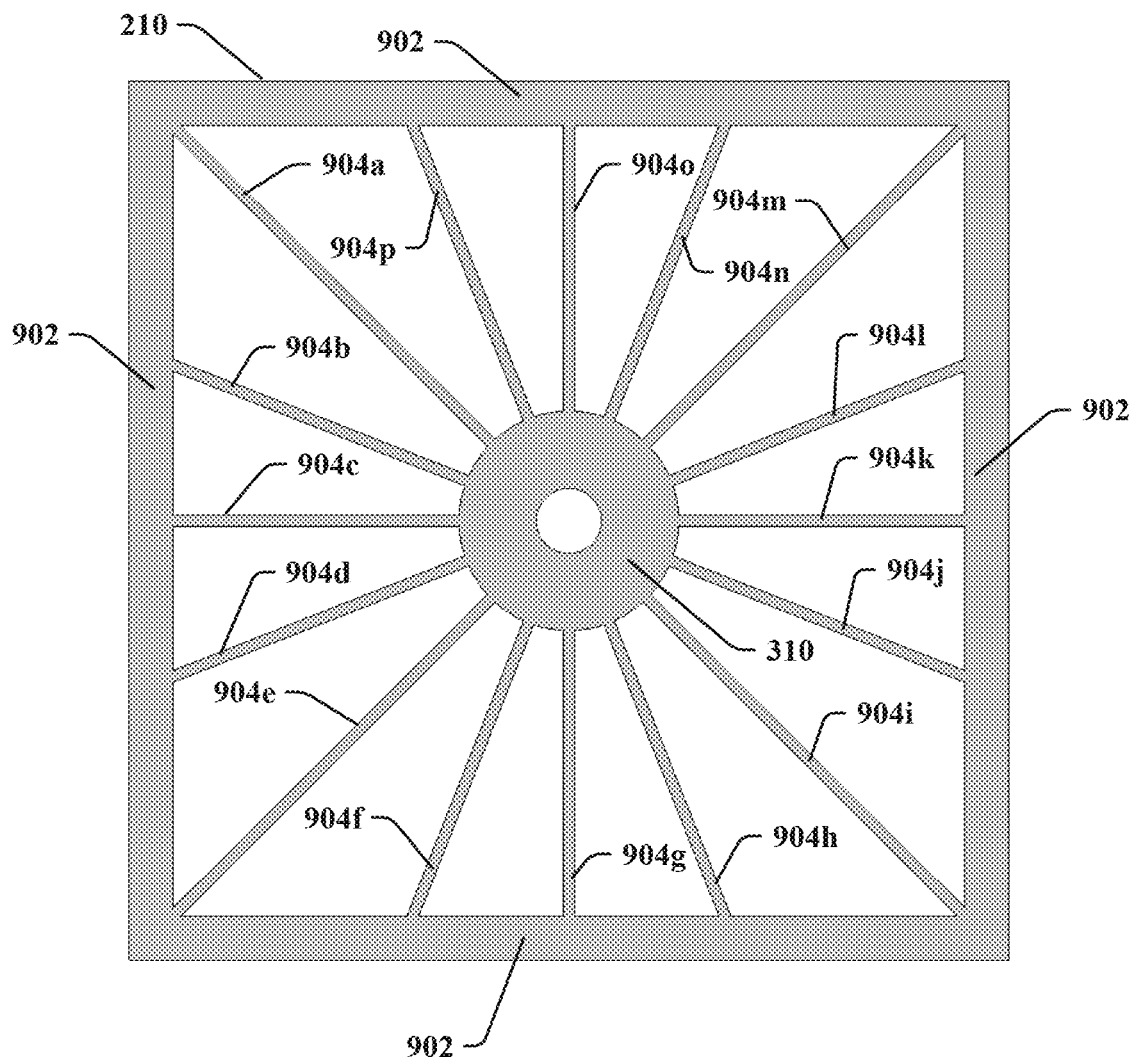
FIG. 9 illustrates a block diagram of an example, non-limiting stackable plate from a top or bottom view in accordance with one or more embodiments described herein.

FIG. 9 illustrates a block diagram of an example, non-limiting stackable plate 210 from a top or bottom view, both of which can appear the same, in accordance with one or more embodiments described herein. Stackable plate 210 has spokes 904a, 904b, 904c, 904d, 904e, 904f, 904g, 904h, 904i, 904j, 904k, 9041, 904m, 904n, 904o, and 904p that extend (e.g., radiate) from core region 310 to outer edge 902 of stackable plate 210.

Figure 10:
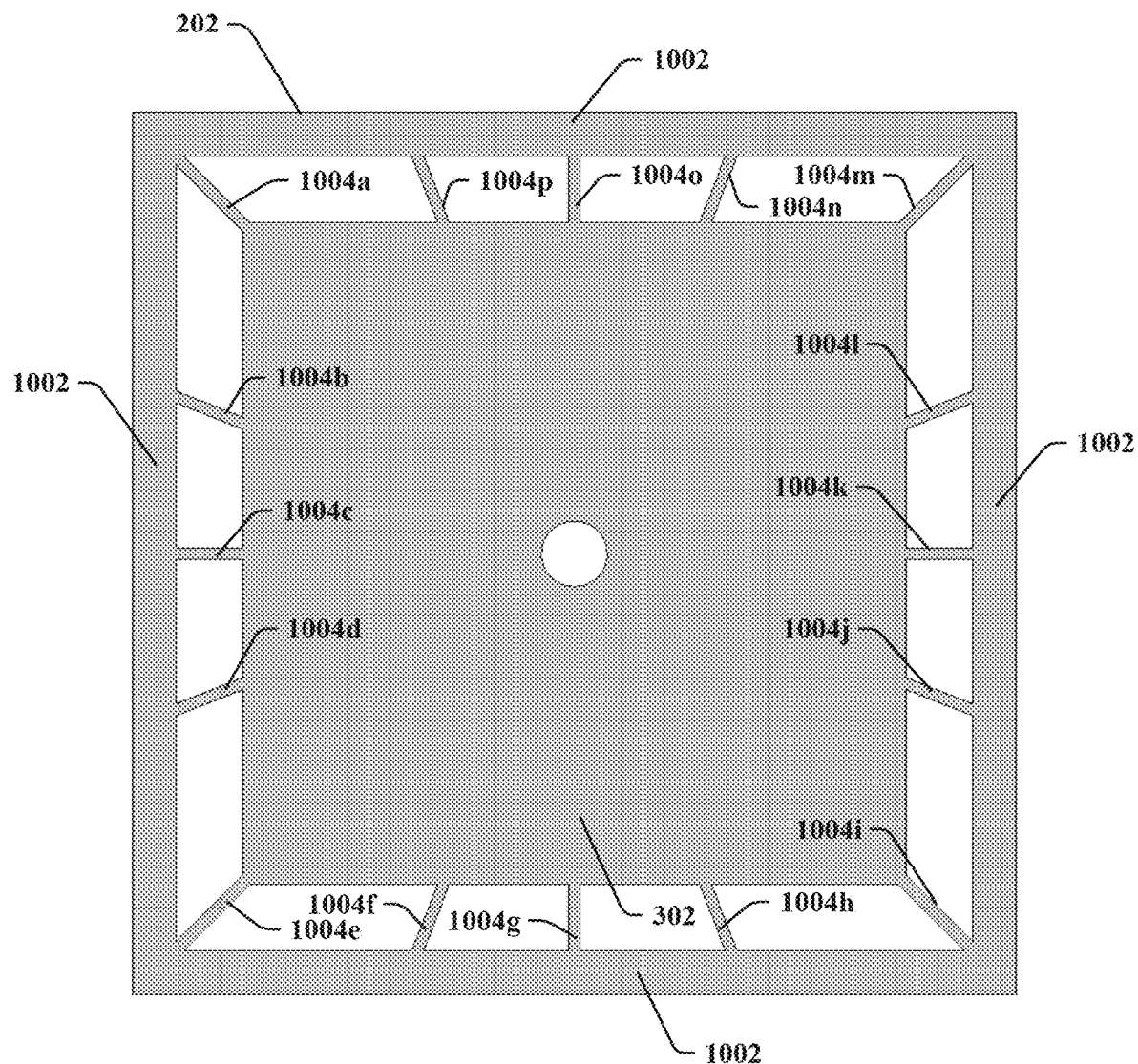
FIG. 10 illustrates a block diagram of an example, non-limiting stackable plate from a top or bottom view in accordance with one or more embodiments described herein.

FIG. 10 illustrates a block diagram of an example, non-limiting stackable plate 202 from a top or bottom view, both of which can appear the same, in accordance with one or more embodiments described herein. Stackable plate 202 has spokes 1004a, 1004b, 1004c, 1004d, 1004e, 1004f, 1004g, 1004h, 1004i, 1004j, 1004k, 10041, 1004m, 1004n, 1004o, and 1004p that extend (e.g., radiate) from central region 302 to outer edge 1002 of stackable plate 202.

Figure 11:
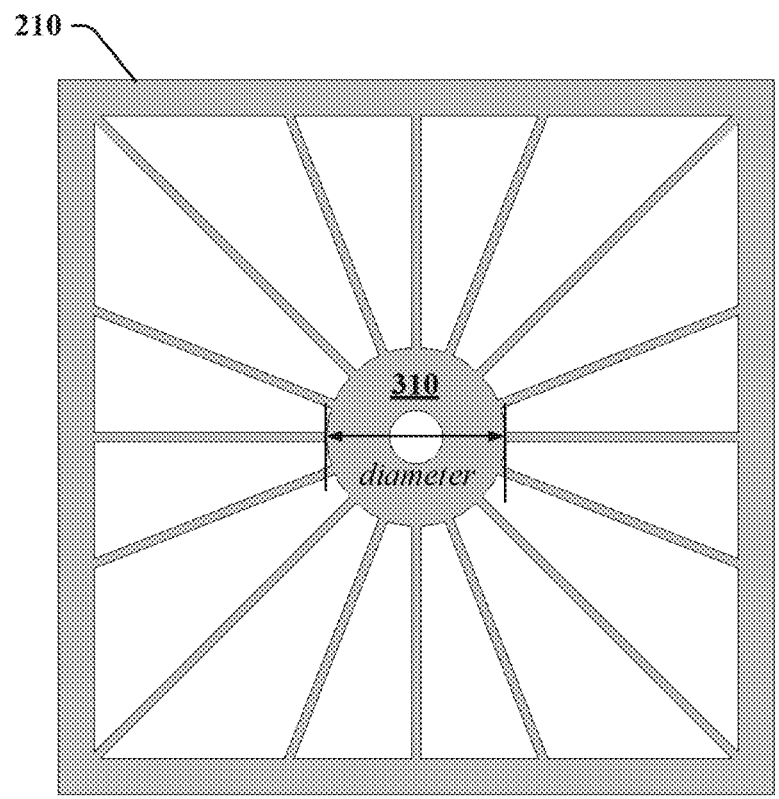
FIG. 11 illustrates a block diagram of example, non-limiting stackable plates in accordance with one or more embodiments described herein.
Figure 11:
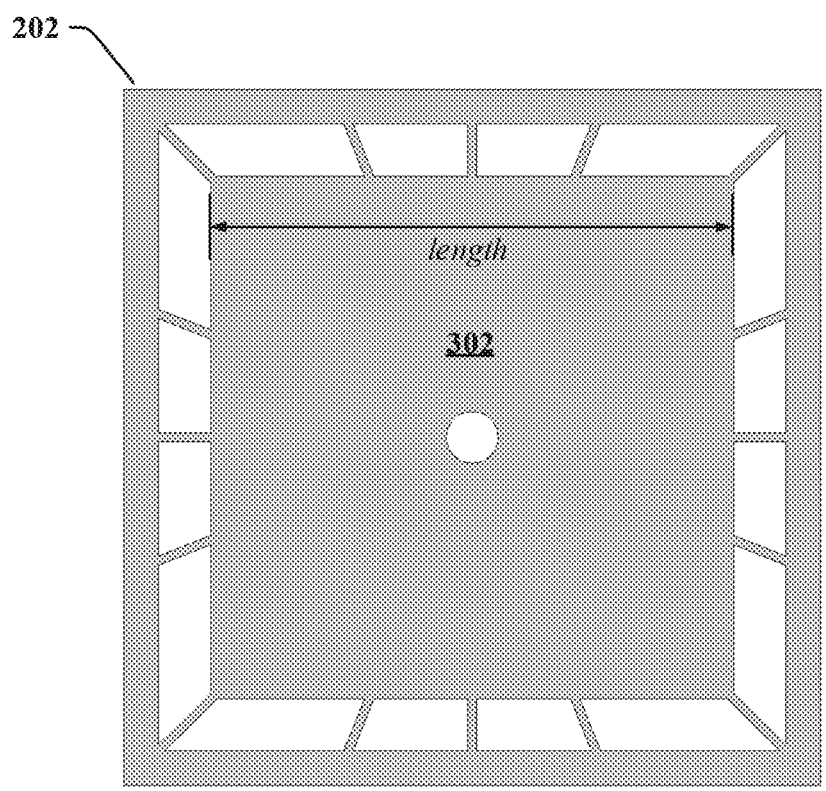

FIG. 11 illustrates a block diagram of an example, non-limiting stackable plate 202 and stackable plate 210 in accordance with one or more embodiments described herein. Stackable plate 210 indicates a diameter dimension of core region 310 and stackable plate 202 indicates a length dimension of central region 302. Since stackable plate 202 is closer to manifold 102 than stackable plate 210, the length dimension of central region 302 can be larger than the diameter dimension of core region 310.

Figure 12A:
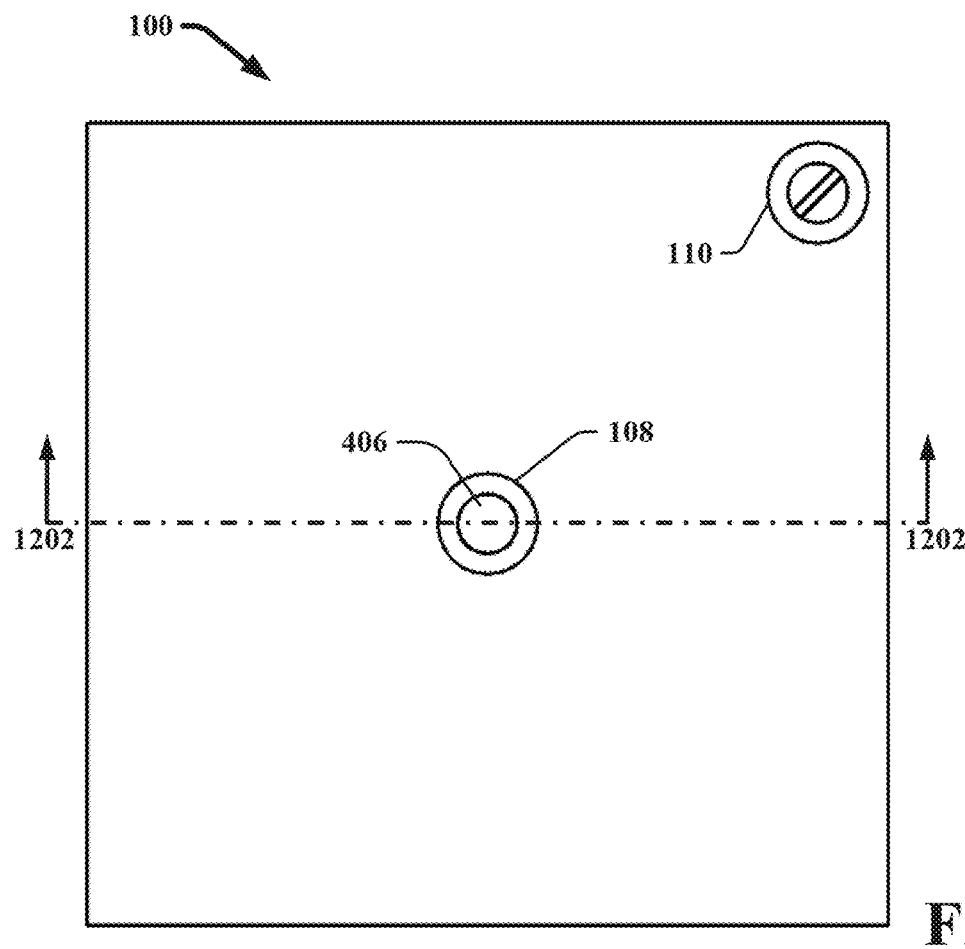
FIG. 12A illustrates a block diagram of an example, non-limiting cold plate with a broken line indicating a plane that intersects the cold plate for the section view of the cold plate that is depicted in FIG. 12B in accordance with one or more embodiments described herein.
Figure 12B:
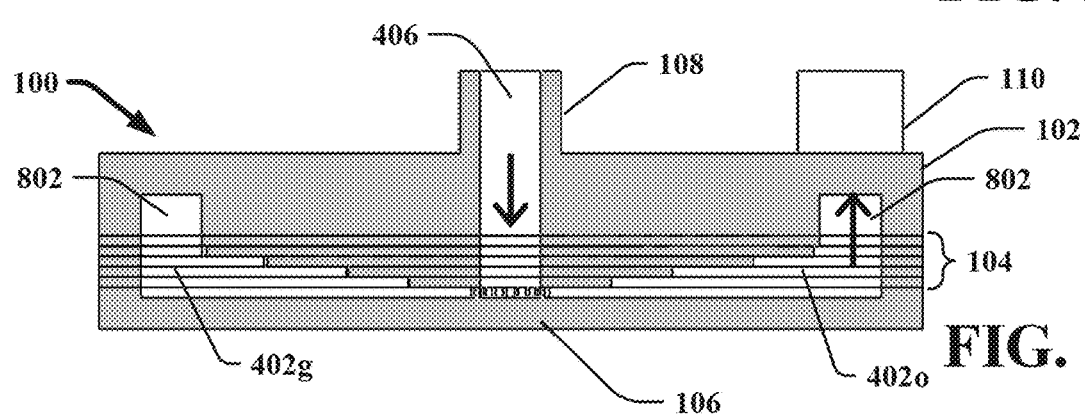
FIG. 12B illustrates a block diagram of an example, non-limiting cold plate from a section view in accordance with one or more embodiments described herein.

FIG. 12A illustrates a block diagram of an example, non-limiting cold plate 100 with a broken line 1202 indicating a plane that intersects cold plate 100 for the section view of cold plate 100 that is depicted in FIG. 12B in accordance with one or more embodiments described herein. The section view in FIG. 12B depicts a first arrow showing the direction of a single phase liquid coolant flowing through inlet 108 into tube 406 towards base plate 106. Base plate 106 can be in contact with or near a heat source. Heat generated from the heat source can cause the single phase liquid coolant to heat up and transform into a two-phase coolant (e.g., into a liquid-vapor state). The heat generated by the heat source is absorbed curing the vaporization of the liquid. The two-phase coolant can pass through the three-dimensional radial expanding microchannels (of which 402g and 402o are depicted) towards channel 802, as shown by the second arrow, and traverse channel 802 and exit cold plate 100 through outlet 110. This allows for the heat to be transported out of the cold plate along with the two-phase coolant.

Figure 13A:
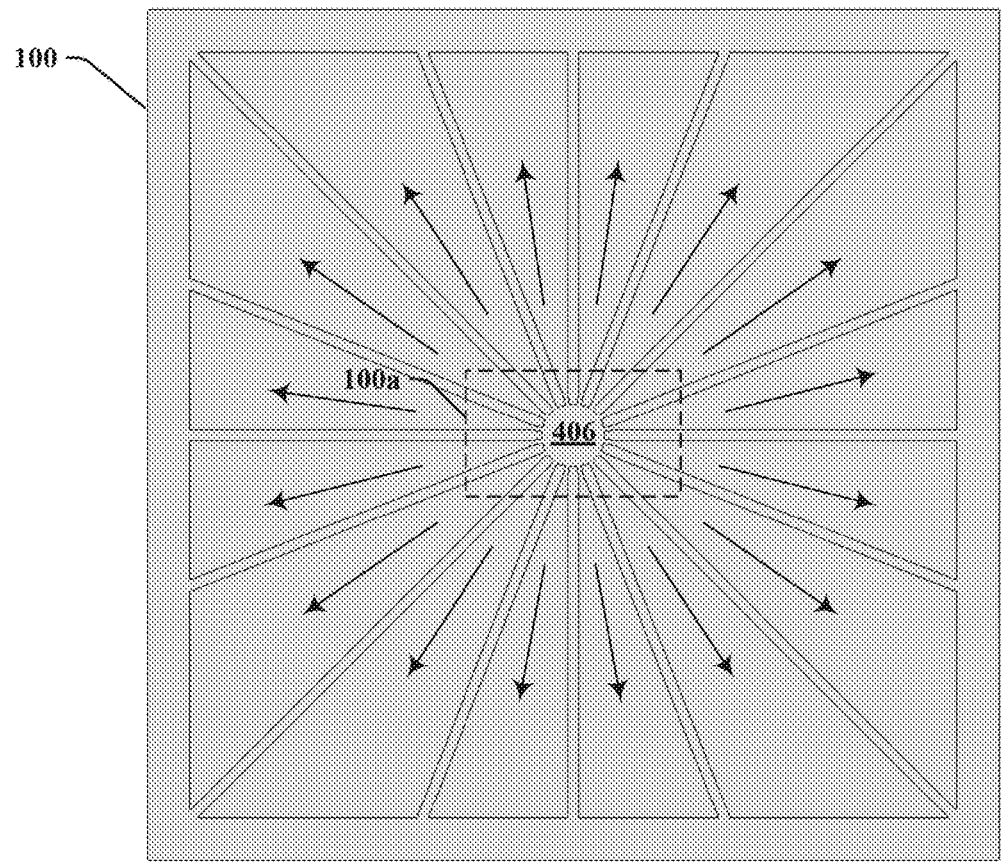
FIG. 13A illustrates a block diagram of an example, non-limiting cold plate in a section view with a plane intersecting between the base plate and a stackable plate in accordance with one or more embodiments described herein.
Figure 13B:
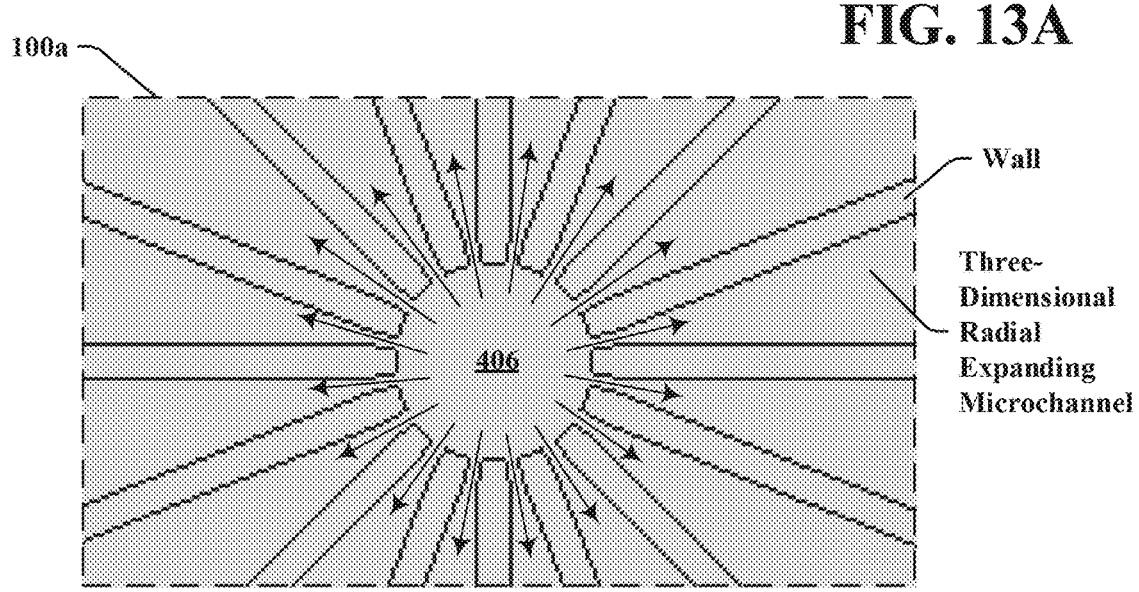
FIG. 13B illustrates a block diagram of a magnified view of a portion of the example, non-limiting cold plate in the section view from FIG. 13A in accordance with one or more embodiments described herein.

FIG. 13A illustrates a block diagram of an example, non-limiting cold plate 100 in a section view of a plane intersecting between base plate 106 and stackable plate 210 in accordance with one or more embodiments described herein. The arrows indicate the flow of coolant through the three-dimensional radial expanding microchannels from tube 406. Element 100a indicates the portion of cold plate 100 from FIG. 13A shown in FIG. 13B in a magnified view. FIG. 13B depicts arrows that indicate the flow of coolant between the spokes of base plate 106 in accordance with one or more embodiments described herein.

Figure 14:
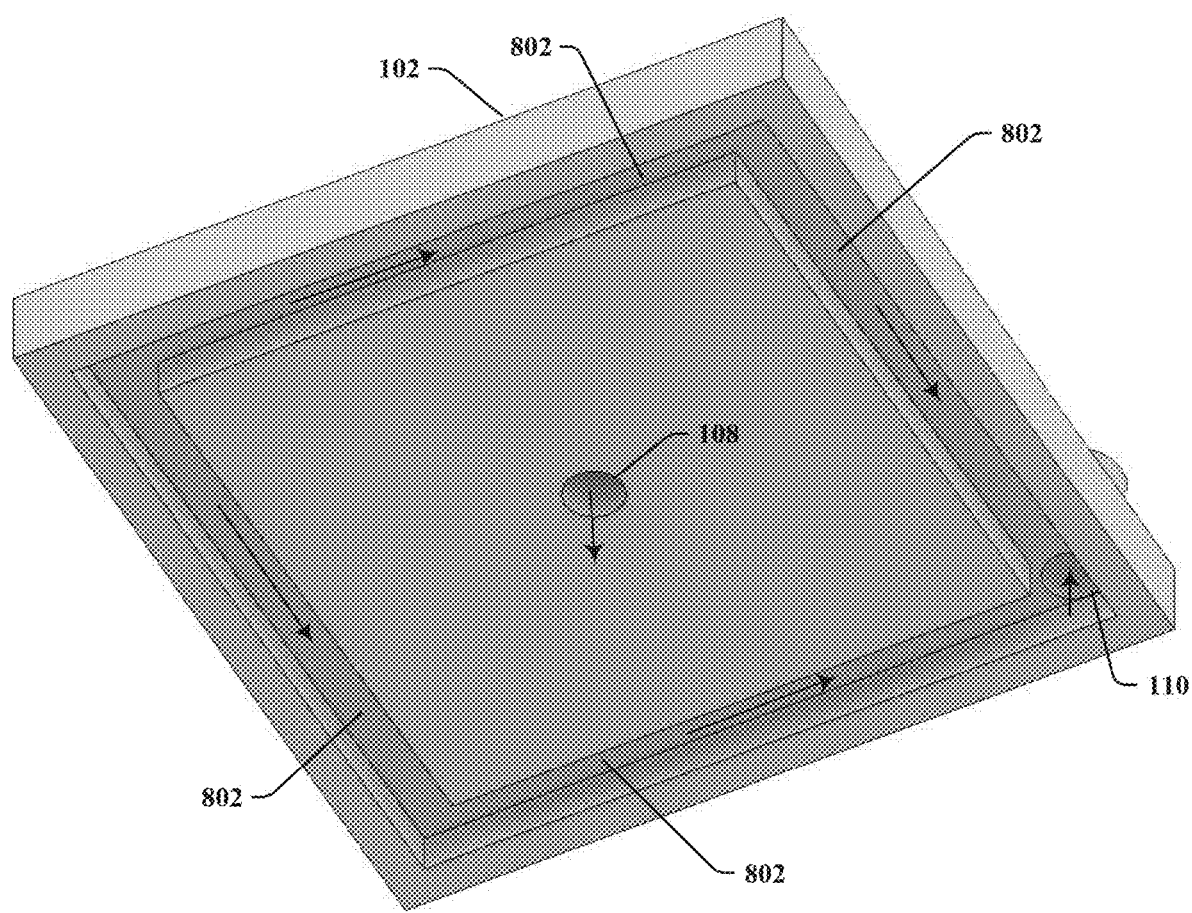
FIG. 14 illustrates a block diagram of an example, non-limiting manifold from a bottom perspective view in accordance with one or more embodiments described herein.

FIG. 14 illustrates a block diagram of an example, non-limiting example manifold 102 from a bottom perspective view in accordance with one or more embodiments described herein. The arrows indicate flow of coolant into inlet 108 and flow of the coolant in the liquid and/or gaseous state after passing through the three-dimensional radial expanding microchannels through channel 802 towards outlet 110, and through outlet 110.

Figure 15A:
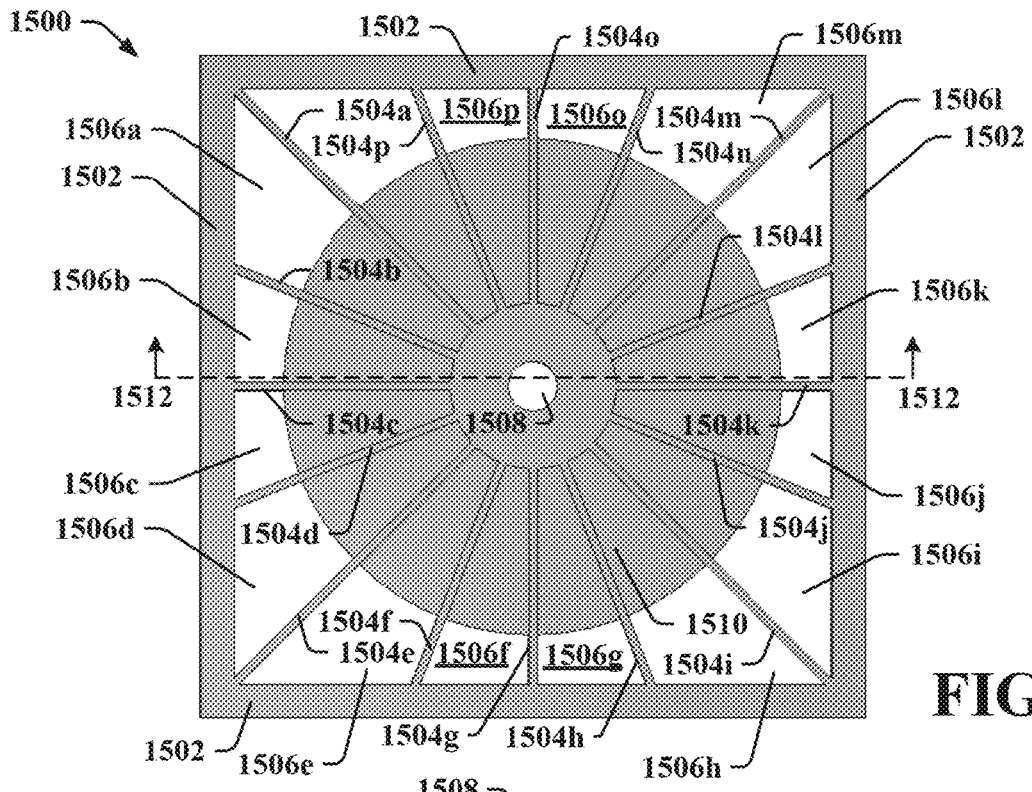
FIG. 15A illustrates a block diagram of an example, non-limiting middle layer from a bottom view in accordance with one or more embodiments described herein.

FIG. 15A illustrates a block diagram of a bottom view of an example, non-limiting middle layer 1500 that can be employed in place of middle layer 104 in cold plate 100 in accordance with one or more embodiments described herein. Middle layer 1500 can include outer wall 1502 and central region 1510. Central region 1510 can include hole 1508 which can align with inlet 108 of manifold 102 of cold plate 100 to form a tube from inlet 108 to base plate 106. Middle layer 1500 can include walls 1504a, 1504b, 1504c, 1504d, 1504e, 1504f, 1504g, 1504h, 1504i, 1504j, 1504k, 15041, 1504m, 1504n, 1504o, and 1504p that extend (e.g., radiate) from central region 1510 to outer wall 1502. Walls 1504a, 1504b, 1504c, 1504d, 1504e, 1504f, 1504g, 1504h, 1504i, 1504j, 1504k, 15041, 1504m, 1504n, 1504o, and 1504p can align with spokes 704a, 704b, 704c, 704d, 704e, 704f, 704g, 704h, 704i, 704j, 704k, 7041, 704m, 704n, 704o, and 704p of base plate 106 in cold plate 100 to form side walls of three-dimensional radial expanding microchannels of cold plate 100. Central region 1510 when stacked with manifold 102 can form ceilings for three-dimensional radial expanding microchannels of cold plate 100. In this example, the ceiling can produce a continuous expansion of the microchannel in the second direction. Middle layer 1500 can be produced using any suitable material for a cold plate 100, non-limiting examples of which include metal, plastic, carbon fiber, graphene, resin, or any other suitable material, or any combination thereof. Furthermore, middle layer 1500 can be produced using any suitable process, non-limiting examples of which can include stamping, punching, machining, chemical etching, laser cutting, three-dimensional printing, or any other suitable process.

Figure 15B:
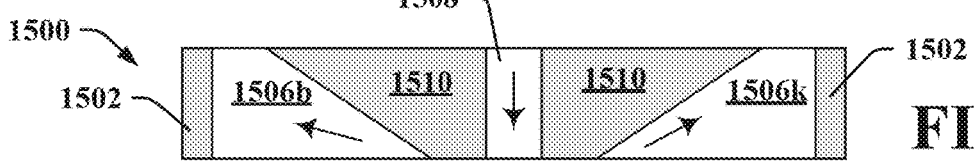
FIG. 15B illustrates a block diagram of an example, non-limiting middle layer from a section view in accordance with one or more embodiments described herein.
Figure 15C:
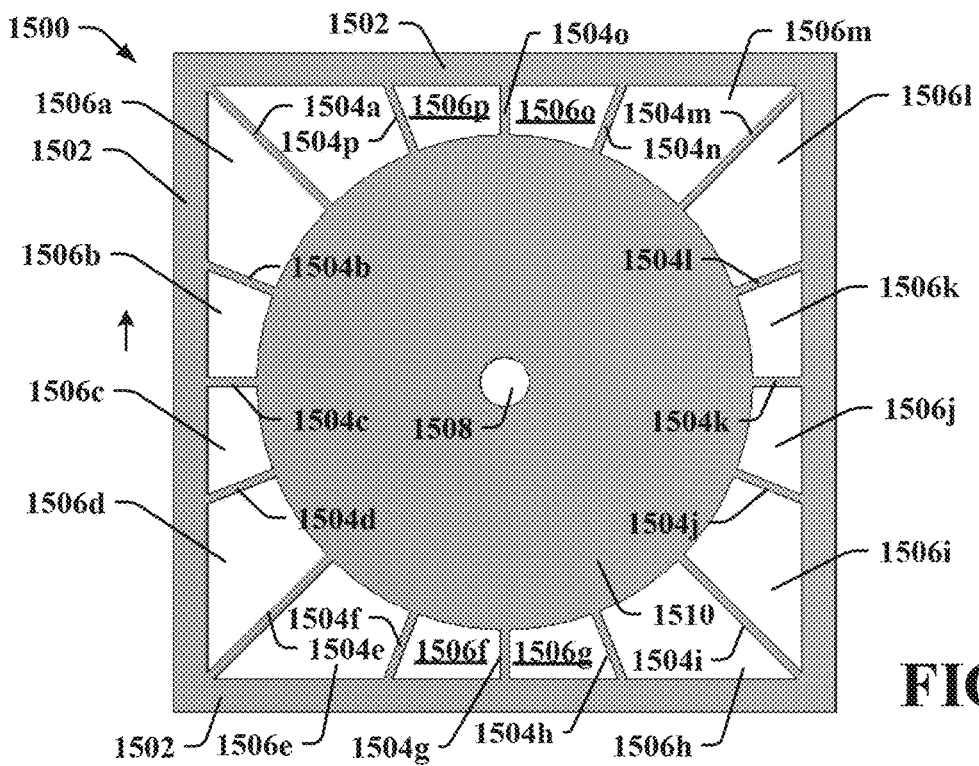
FIG. 15C illustrates a block diagram of an example, non-limiting middle layer from a top view in accordance with one or more embodiments described herein.

Broken line 1512 indicates location of a plane that intersects middle layer 1500 for the section view of middle layer 1500 that is depicted in FIG. 15B in accordance with one or more embodiments described herein. The section view in FIG. 15B depicts a first arrow showing the direction of a single phase liquid coolant flowing through hole 1508 towards base plate 106, and second arrows that indicate direction two-phase coolant flowing through orifices (of which 1506b and 1506k are depicted) which make up part of the three-dimensional radial expanding microchannels towards channel 802 of manifold 102. FIG. 15C illustrates a block diagram of an example, non-limiting example middle layer 1500 from a top view in accordance with one or more embodiments described herein.

Figure 16:
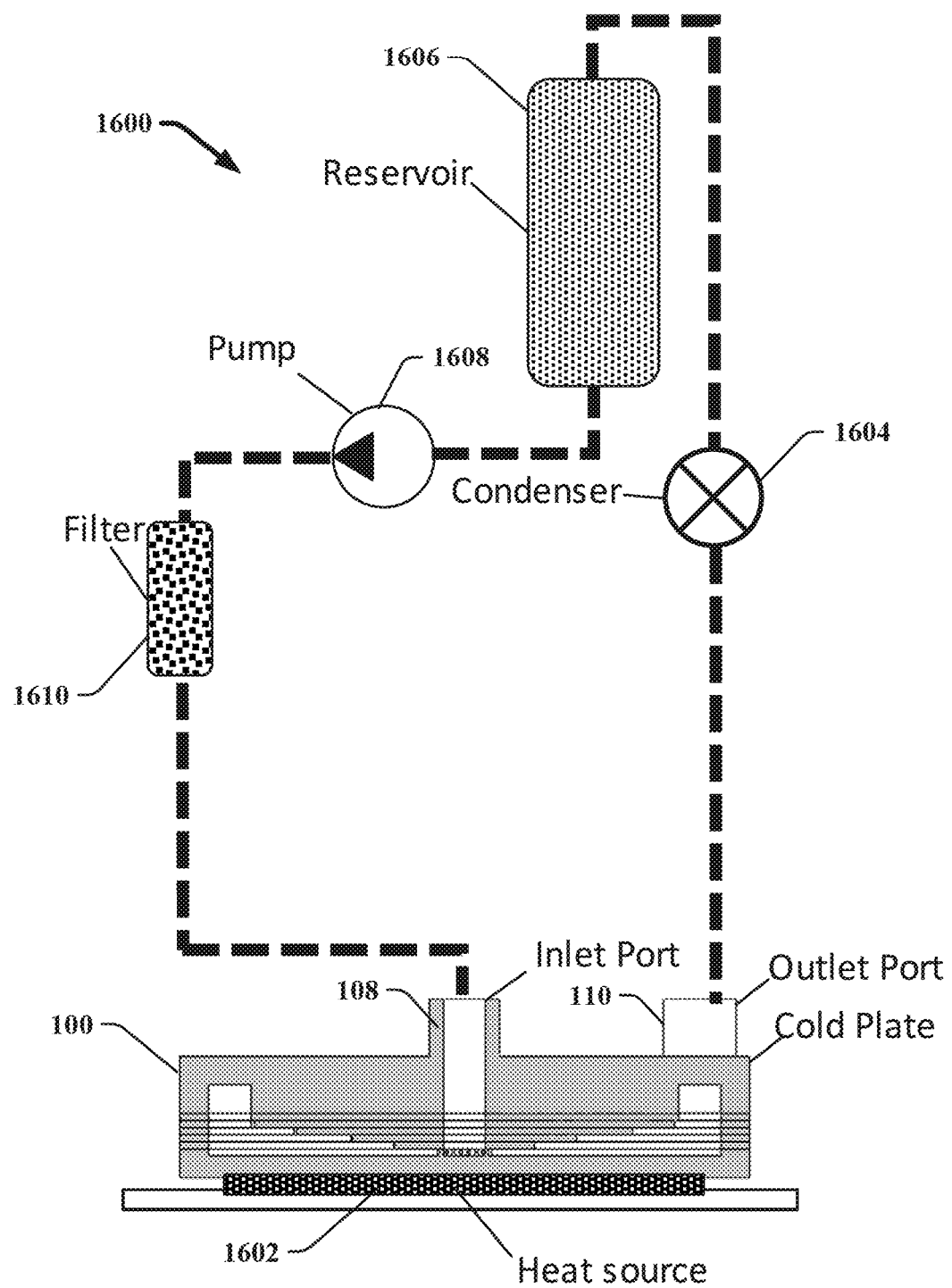
FIG. 16 illustrates a block diagram of an example, non-limiting cooling system that facilitates dissipating heat in accordance with one or more embodiments described herein.

FIG. 16 illustrates a block diagram of an example, non-limiting cooling system 1600 that facilitates dissipating heat in accordance with one or more embodiments described herein. Cooling system 1600 can include a reservoir 1606, a pump 1608, a filter 1610, a cold plate 100, and a condenser 1604. Reservoir 1606 can house a coolant (e.g. a cooling fluid, water, liquid nitrogen, liquid helium, or any other suitable liquid coolant) in some embodiments and can have one or more outlets that are connected to one or more inlets of pump 1608 as depicted by the dashed line between reservoir 1606 and pump 1608. Pump 1608 can have one or more outlets that are connected to one or more inlets of filter 1610 as depicted by the dashed line between pump 1608 and filter 1610. Filter 1610 can have one or more outlets that are connected to one or more inlets 108 of cold plate 100 as depicted by the dashed line between filter 1610 and cold plate 100. Cold plate 100 can have one or more outlets 110 that are connected to one or more inlets of condenser 1604 as depicted by the dashed line between cold plate 100 and condenser 1604. Condenser 1604 can have one or more outlets that are connected to one or more inlets of reservoir 1606 as depicted by the dashed line between condenser 1604 and reservoir 1606. The connections between outlets an inlets of a reservoir 1606, a pump 1608, a filter 1610, a cold plate 100, and a condenser 1604 can be through any suitable connecting component through which single phase liquid coolant and/or two-phase coolant can be transported, non-limiting examples of which can include a pipe, a tube, coupling, or any other suitable connecting component. Pump 1608 can include or be connected to a controller (not shown) that controls pump 1608 to pump coolant from reservoir 1606 through cooling system 1600. Cooling system 1600 can include one or more temperature sensors (not shown) that measure a temperature of a heat source 1602 and provide temperature readings to the controller to be employed in making decisions regarding pumping coolant through cooling system 1600.

Cold plate 100 can be located at a defined position relative to the heat source 1602, for example, a position that allows for cold plate 100 to dissipate heat generated by heat source 1602. Coolant can be pumped from reservoir 1606 as a single phase liquid coolant by pump 1608 and pass through filter 1610 in order to filter out any undesired material from the coolant. The single phase liquid coolant can move to inlet 108 from filter 1610 and enter cold plate 100.

The single phase liquid coolant can be converted to a two-phase coolant in cold plate 100 as the single phase liquid coolant absorbs heat from the heat source and vaporizes. The two-phase coolant can exit cold plate 100 through outlet 110 and move to condenser 1604 where the two-phase coolant can be transformed back into a single phase liquid coolant. The single phase liquid coolant can leave condenser 1604 and move to reservoir 1606. The cycle described herein and shown in FIG. 16 can continue as long as pump 1608 is pumping coolant from reservoir 1606.

Heat source 1602 can be any suitable component of a device that generates heat, non-limiting examples of which include, a processor component, a memory component, field programmable gate array (FPGA), a motor, a chipset, a graphics component, a power supply, a disk drive, a laser component, an illumination component, or any other suitable component of a device that generates heat.

It is to be appreciated that cooling system 1600 can also include any other suitable components employed in a cooling system. Additionally, filter 1610 can be optional in cooling system 1600.

In another embodiment, filter 1610 or pump 1608 can have one or more outlets that are connected to inlets 108 of a plurality of cold plates 100, and outlets 110 of the plurality of cold plates 100 can be connected to the one or more inlets of condenser 1604.

Figure 17:
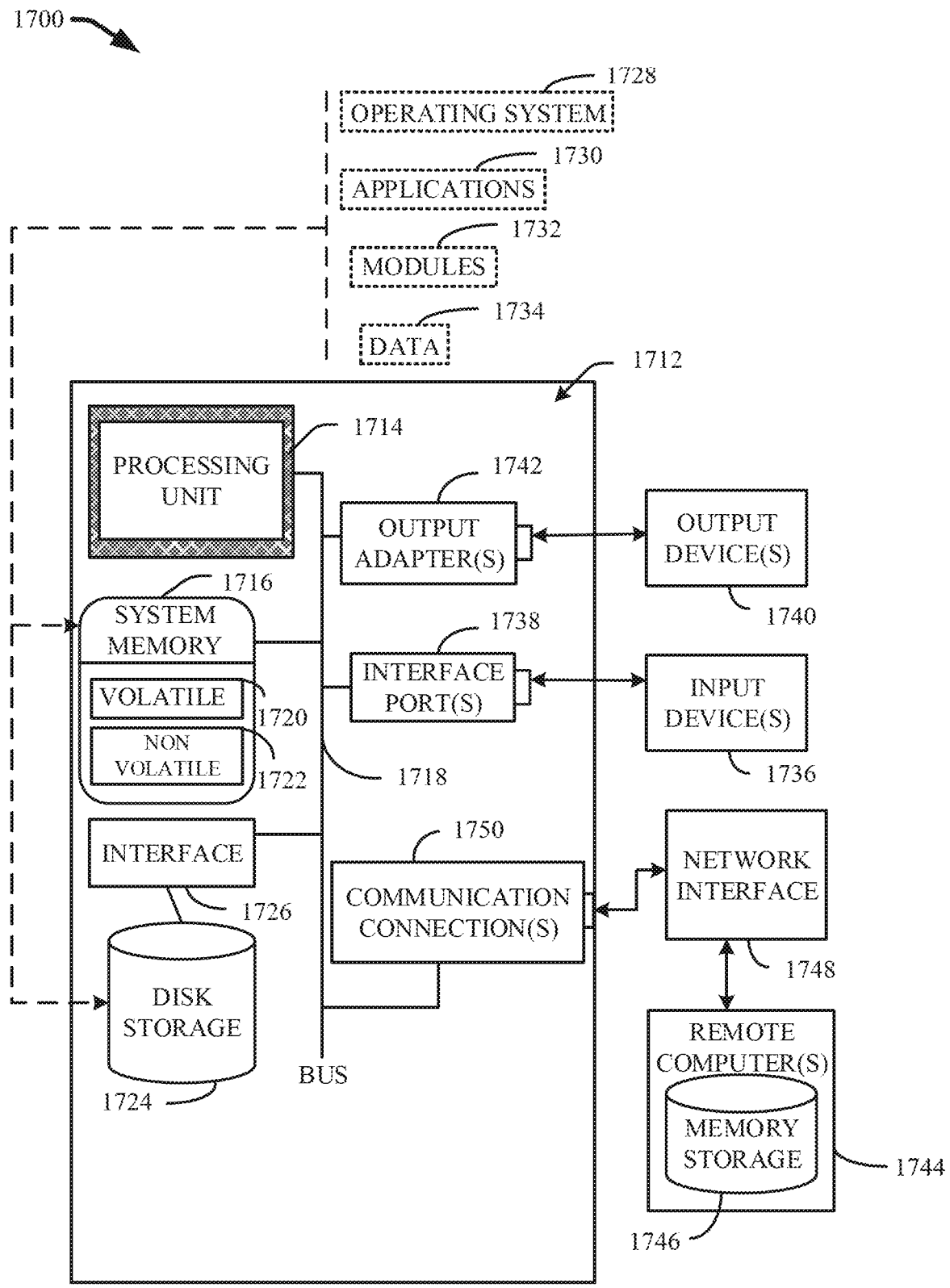
FIG. 17 illustrates a block diagram of an example, non-limiting operating environment in which one or more embodiments described herein can be facilitated.

In order to provide a context for the various aspects of the disclosed subject matter, FIG. 17 as well as the following discussion are intended to provide a general description of a suitable environment in which the various aspects of the disclosed subject matter can be implemented. FIG. 17 illustrates a block diagram of an example, non-limiting operating environment in which one or more embodiments described herein can be facilitated. Repetitive description of like elements employed in other embodiments described herein is omitted for sake of brevity.

With reference to FIG. 17, a suitable operating environment 1700 for implementing various aspects of this disclosure can also include a computer 1712. The computer 1712 can also include a processing unit 1714, a system memory 1716, and a system bus 1718. The system bus 1718 couples system components including, but not limited to, the system memory 1716 to the processing unit 1714. The processing unit 1714 can be any of various available processors. Dual microprocessors and other multiprocessor architectures also can be employed as the processing unit 1714. The system bus 1718 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1794), and Small Computer Systems Interface (SCSI). The system memory 1716 can also include volatile memory 1720 and nonvolatile memory 1722. The basic input/output system (BIOS), containing the basic routines to transfer information between elements within the computer 1712, such as during start-up, is stored in nonvolatile memory 1722. By way of illustration, and not limitation, nonvolatile memory 1722 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1720 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1712 can also include removable/non-removable, volatile/non-volatile computer storage media. FIG. 17 illustrates, for example, a disk storage 1724. Disk storage 1724 can also include, but is not limited to, devices like a magnetic disk drive, floppy disk drive, tape drive, Jaz drive, Zip drive, LS-100 drive, flash memory card, or memory stick. The disk storage 1724 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1724 to the system bus 1718, a removable or non-removable interface is typically used, such as interface 1726. FIG. 17 also depicts software that acts as an intermediary between users and the basic computer resources described in the suitable operating environment 1701. Such software can also include, for example, an operating system 1728. Operating system 1728, which can be stored on disk storage 1724, acts to control and allocate resources of the computer 1712. System applications 1730 take advantage of the management of resources by operating system 1728 through program modules 1732 and program data 1734, e.g., stored either in system memory 1716 or on disk storage 1724. It is to be appreciated that this disclosure can be implemented with various operating systems or combinations of operating systems. A user enters commands or information into the computer 1712 through input device(s) 1736. Input devices 1736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1714 through the system bus 1718 via interface port(s) 1738. Interface port(s) 1738 include, for example, a serial port, a parallel port, a game port, and a universal serial bus (USB). Output device(s) 1740 use some of the same type of ports as input device(s) 1736. Thus, for example, a USB port can be used to provide input to computer 1712, and to output information from computer 1712 to an output device 1740. Output adapter 1742 is provided to illustrate that there are some output devices 1740 like monitors, speakers, and printers, among other output devices 1740, which require special adapters. The output adapters 1742 include, by way of illustration and not limitation, video and sound cards that provide a means of connection between the output device 1740 and the system bus 1718. It should be noted that other devices and/or systems of devices provide both input and output capabilities such as remote computer(s) 1744.

Computer 1712 can operate in a networked environment using logical connections to one or more remote computers, such as remote computer(s) 1744. The remote computer(s) 1744 can be a computer, a server, a router, a network PC, a workstation, a microprocessor based appliance, a peer device or other common network node and the like, and typically can also include many or all of the elements described relative to computer 1712. For purposes of brevity, only a memory storage device 1746 is illustrated with remote computer(s) 1744. Remote computer(s) 1744 is logically connected to computer 1712 through a network interface 1748 and then physically connected via communication connection 1750. Network interface 1748 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1750 refers to the hardware/software employed to connect the network interface 1748 to the system bus 1718. While communication connection 1750 is shown for illustrative clarity inside computer 1712, it can also be external to computer 1712. The hardware/software for connection to the network interface 1748 can also include, for exemplary purposes only, internal and external technologies such as, modems including regular telephone grade modems, cable modems and DSL modems, ISDN adapters, and Ethernet cards.

Embodiments of the present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a server computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A cold plate comprising:
   a middle layer comprising:
      plates respectively comprising orifices, wherein the plates are stacked to align the respective orifices to form a plurality of microchannels, wherein a microchannel of the plurality of microchannels extends in a first direction from a central region surrounding an internal point of the cold plate to an outer wall of the cold plate, and wherein the microchannel, from the central region to the outer wall along the first direction:
         increasingly expands in a second direction that is orthogonal to the first direction, and
         increasingly expands in a third direction that is orthogonal to the first direction and that is orthogonal to the second direction, wherein the increasing expansion in the third direction passes through each of the plates of the middle layer.

2. The cold plate of claim 1, further comprising:
   a cold plate inlet connected to first openings of the plurality of microchannels that are nearest to the internal point of the cold plate;
   a channel connected to second openings of the plurality of microchannels that are nearest to the outer walls of the cold plate; and
   a cold plate outlet connected to the channel.

3. The cold plate of claim 1, wherein the internal point is at a center of the cold plate.

4. The cold plate of claim 1, wherein the outer wall of the cold plate has a square shape.

5. The cold plate of claim 1, wherein the outer wall of the cold plate has a rectangular shape.

6. The cold plate of claim 1, wherein the outer wall of the cold plate has an elliptical shape.

7. The cold plate of claim 1, wherein the cold plate comprises a graphene material.

8. A system, comprising:
   a cold plate comprising:
      a middle layer comprising:
         plates respectively comprising orifices, wherein the plates are stacked to align the respective orifices to form a plurality of microchannels, wherein a microchannel of the plurality of microchannels extends in a first direction from a central region surrounding an internal point of the cold plate to an outer wall of the cold plate, and wherein the microchannel, from the central region to the outer wall along the first direction:
            increasingly expands in a second direction that is orthogonal to the first direction, and
            increasingly expands in a third direction that is orthogonal to the first direction and that is orthogonal to the second direction, wherein the increasing expansion in the third direction passes through each of the plates of the middle layer; and
   a device that produces heat, and
   wherein the cold plate is configured to dissipate the heat from the device.

9. The system of claim 8, wherein the cold plate further comprises:
   a cold plate inlet connected to first openings of the plurality of microchannels that are nearest to the internal point of the cold plate;
   a channel connected to second openings of the microchannel that are nearest to the outer walls of the cold plate; and
   a cold plate outlet connected to the channel.

10. The system of claim 9, further comprising:
   a reservoir comprising a reservoir inlet and a reservoir outlet, wherein the reservoir is disposed to house a coolant liquid;
   a pump comprising a pump inlet and a pump outlet, wherein the pump inlet is coupled to the reservoir outlet; and
   a condenser comprising a condenser inlet and a condenser outlet, wherein the condenser outlet is coupled to the reservoir inlet, wherein the cold plate inlet is coupled to the pump outlet and wherein the cold plate outlet is coupled to the condenser inlet.

11. The system of claim 10, wherein the cold plate inlet and the central region forms a column for the coolant liquid to flow to the first openings.

12. The system of claim 10, wherein the reservoir houses a defined quantity of the coolant liquid.

13. The system of claim 12, wherein the pump pumps the coolant liquid from the reservoir to the cold plate to the condenser and to the reservoir.

14. The system of claim 13, further comprising a controller that controls the pump.

15. The system of claim 14, further comprising a temperature sensor that measures a temperature of the device that produces the heat.

16. The system of the claim 15, wherein the controller controls the pump based on the measured temperature of the device that produces the heat.

17. The system of claim 8, wherein the cold plate has a first shape that matches a second shape of the device that produces the heat.

18. The system of claim 8, wherein the cold plate has a first shape that matches a second shape of a portion of the device that produces the heat.

19. A system, comprising:
   a cold plate comprising:
      a middle layer comprising:
         plates respectively comprising orifices, wherein the plates are stacked to align the respective orifices to form a plurality of microchannels, wherein a microchannel of the plurality of microchannels, wherein the microchannel extends in a first direction from a central region surrounding an internal point of the cold plate to an outer wall of the cold plate, and wherein the microchannel, from the central region to the outer wall along the first direction:
            increasingly expands in a second direction that is orthogonal to the first direction, and
            increasingly expands in a third direction that is orthogonal to the first direction and that is orthogonal to the second direction, wherein the increasing expansion in the third direction passes through each of the plates of the middle layer; and
a processor,
wherein the cold plate is adjacent to the processor.

20. The system of claim 19, wherein the microchannels are arranged radially around the central region.

* * * * *